US012593443B2

(12) United States Patent
Cui et al.

(10) Patent No.: US 12,593,443 B2
(45) Date of Patent: Mar. 31, 2026

(54) SEMICONDUCTOR STRUCTURE AND MANUFACTURING METHOD THEREOF

(71) Applicants:CHANGXIN MEMORY TECHNOLOGIES, INC., Hefei City (CN); CHANGXIN JIDIAN (BEIJING) MEMORY TECHNOLOGIES CO., LTD., Beijing (CN)

(72) Inventors: Zhaopei Cui, Hefei City (CN); Ying Song, Hefei City (CN)

(73) Assignees: CHANGXIN MEMORY TECHNOLOGIES, INC., Hefei (CN); CHANGXIN JIDIAN (BEIJING) MEMORY TECHNOLOGIES CO., LTD., Beijing (CN)

( * ) Notice: Subject to any disclaimer, the term of this patent is extended or adjusted under 35 U.S.C. 154(b) by 514 days.

(21) Appl. No.: 18/149,750

(22) Filed: Jan. 4, 2023

(65) Prior Publication Data

US 2023/0354586 A1     Nov. 2, 2023

(30) Foreign Application Priority Data

Apr. 29, 2022     (CN) .......................... 202210462432.9

(51) Int. Cl.
*H10B 12/00*          (2023.01)
(52) U.S. Cl.
CPC .......... *H10B 12/482* (2023.02); *H10B 12/09* (2023.02); *H10B 12/488* (2023.02); *H10B 12/50* (2023.02)
(58) Field of Classification Search
CPC .... H10B 12/482; H10B 12/50; H10B 12/488; H10B 12/09
See application file for complete search history.

(56) References Cited

U.S. PATENT DOCUMENTS

| | | | | |
|---|---|---|---|---|
| 8,304,824 | B2 | 11/2012 | Kim et al. | |
| 11,183,579 | B2 | 11/2021 | Kim | |
| 11,251,188 | B2 * | 2/2022 | Kim | H10B 12/05 |
| 12,396,161 | B2 * | 8/2025 | Shao | H10D 30/6735 |
| 2016/0268432 | A1 | 9/2016 | Inaba | |
| 2018/0358363 | A1 | 12/2018 | Nagai | |
| 2021/0143157 | A1 | 5/2021 | Nam et al. | |

FOREIGN PATENT DOCUMENTS

| | | |
|---|---|---|
| CN | 208767278 U | 4/2019 |
| CN | 108807382 B | 11/2020 |
| CN | 112103341 A | 12/2020 |
| CN | 113594097 A | 11/2021 |

OTHER PUBLICATIONS

First Office Action cited in CN202210462432.9, mailed Jun. 28, 2022, 16 pages.

* cited by examiner

*Primary Examiner* — Richard A Booth

(74) *Attorney, Agent, or Firm* — Kilpatrick Townsend & Stockton LLP

(57)          ABSTRACT

The present disclosure provides a semiconductor structure and a manufacturing method thereof, and relates to the technical field of semiconductors. The semiconductor structure includes: a base, where the base includes a memory array region and a peripheral circuit region around the memory array region; a plurality of buried bit lines disposed in the memory array region of the base; and at least one buried gate disposed in the peripheral circuit region of the base.

16 Claims, 16 Drawing Sheets

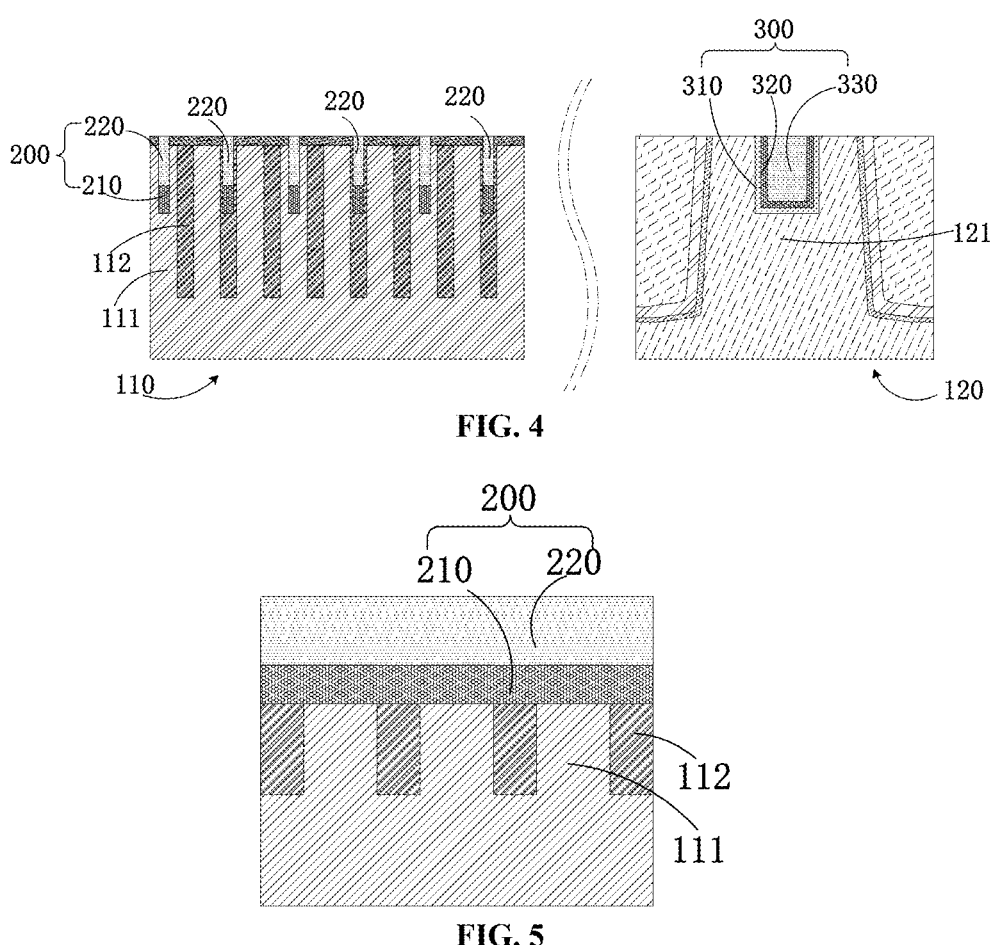
FIG. 4
FIG. 5
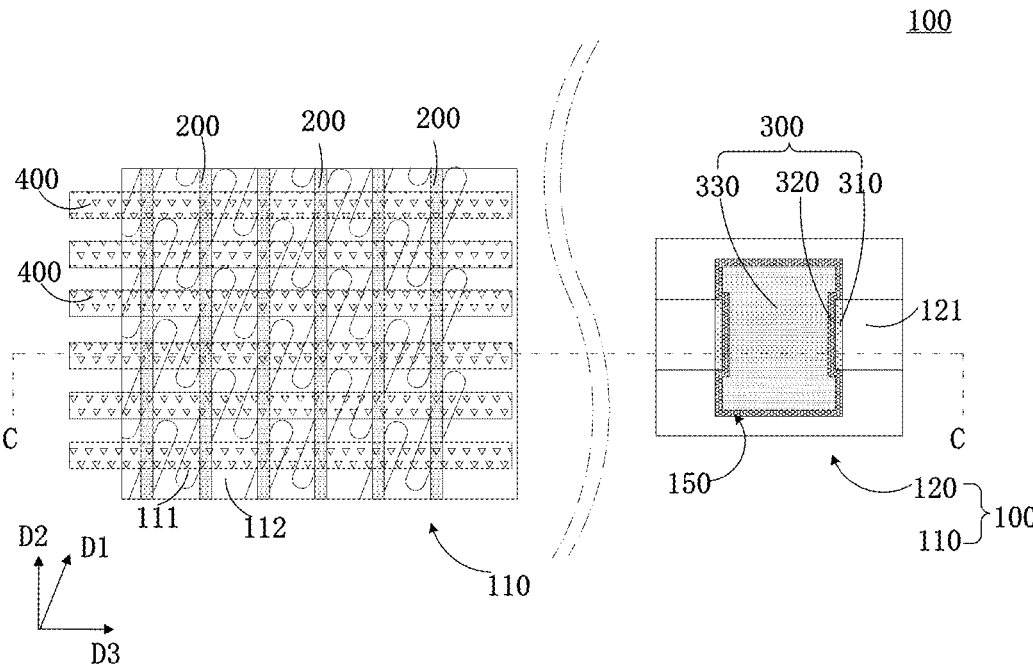
FIG. 6

Provide a base, where the base includes a memory array region and a peripheral circuit region around the memory array region ⌐ S110

Form a plurality of buried bit lines in the memory array region, and form at least one buried gate in the peripheral circuit region ⌐ S120

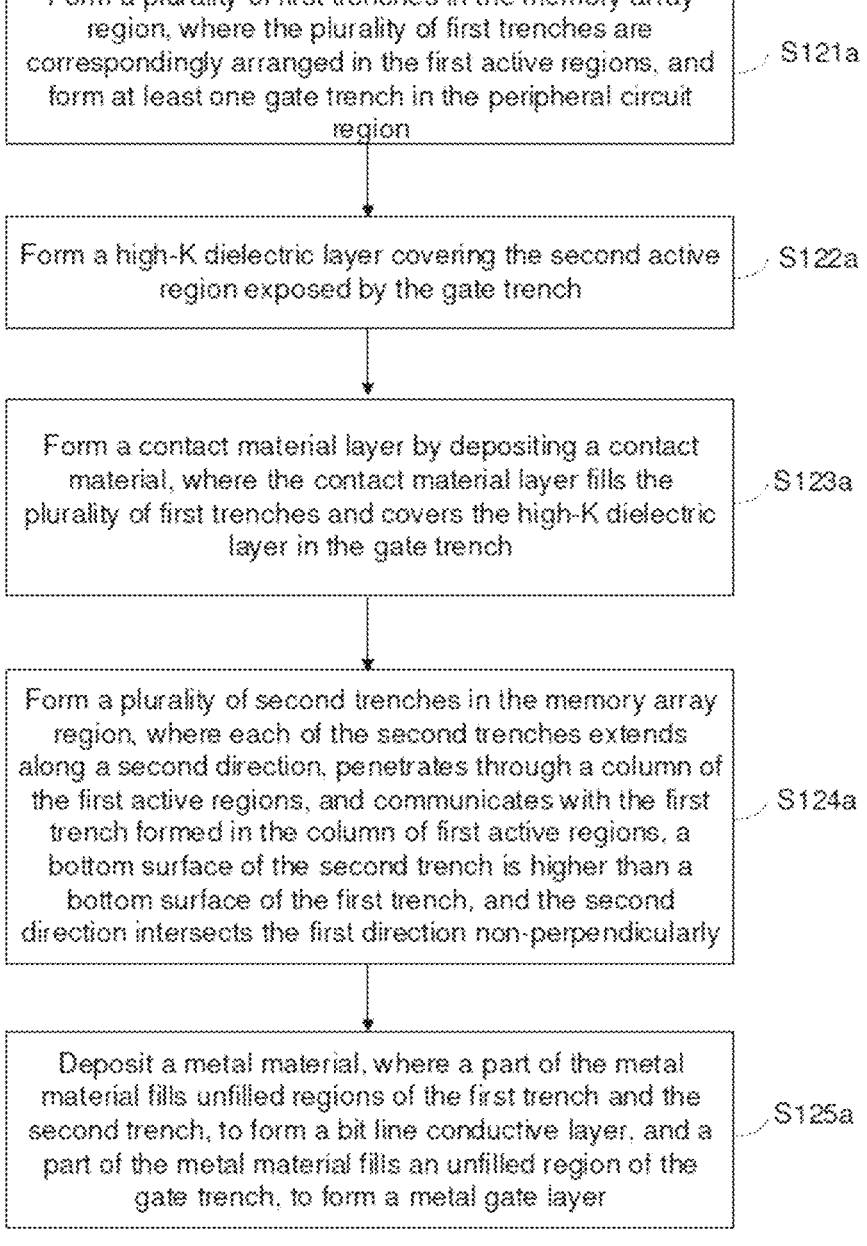

Form a plurality of first trenches in the memory array region, where the plurality of first trenches are correspondingly arranged in the first active regions, and form at least one gate trench in the peripheral circuit region ⟋ S121a Form a high-K dielectric layer covering the second active region exposed by the gate trench ⟋ S122a Form a contact material layer by depositing a contact material, where the contact material layer fills the plurality of first trenches and covers the high-K dielectric layer in the gate trench ⟋ S123a Form a plurality of second trenches in the memory array region, where each of the second trenches extends along a second direction, penetrates through a column of the first active regions, and communicates with the first trench formed in the column of first active regions, a bottom surface of the second trench is higher than a bottom surface of the first trench, and the second direction intersects the first direction non-perpendicularly ⟋ S124a Deposit a metal material, where a part of the metal material fills unfilled regions of the first trench and the second trench, to form a bit line conductive layer, and a part of the metal material fills an unfilled region of the gate trench, to form a metal gate layer ⟋ S125a

FIG. 35

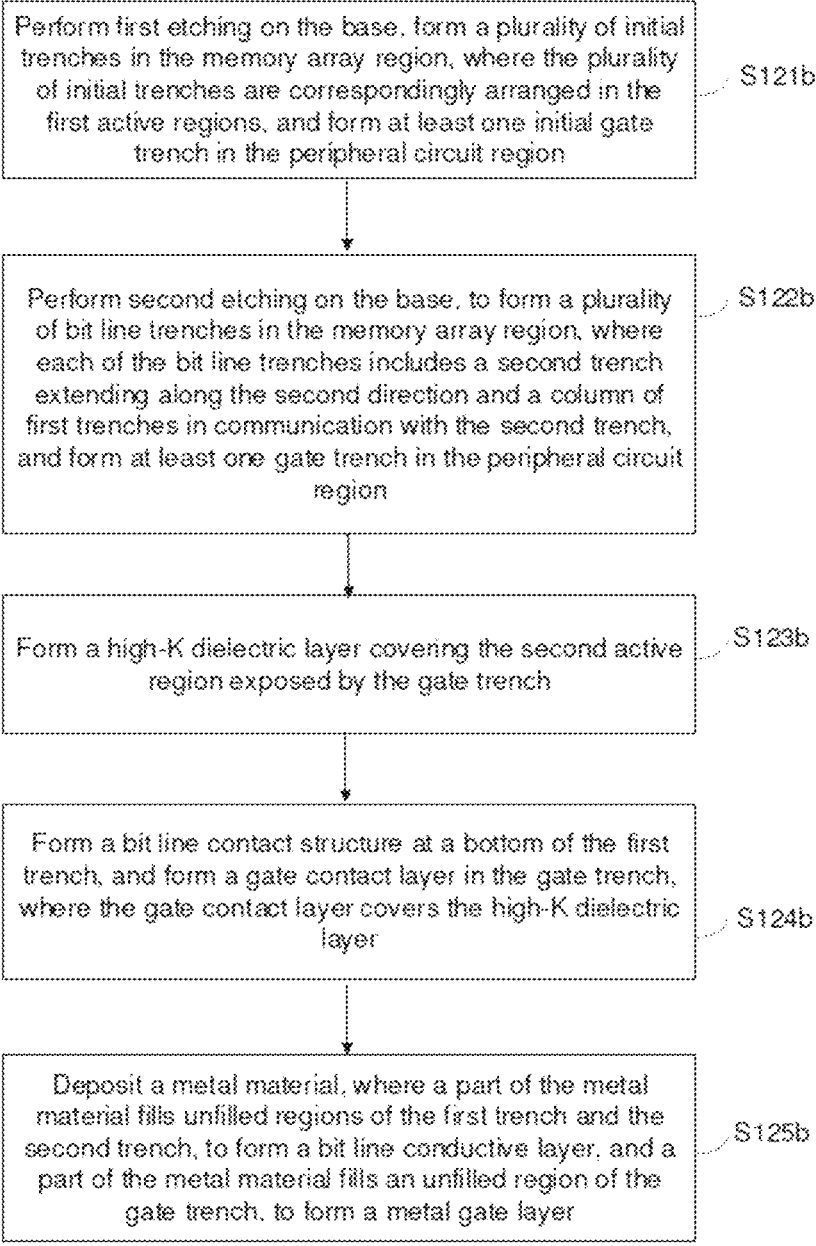

Perform first etching on the base, form a plurality of initial trenches in the memory array region, where the plurality of initial trenches are correspondingly arranged in the first active regions, and form at least one initial gate trench in the peripheral circuit region — S121b Perform second etching on the base, to form a plurality of bit line trenches in the memory array region, where each of the bit line trenches includes a second trench extending along the second direction and a column of first trenches in communication with the second trench, and form at least one gate trench in the peripheral circuit region — S122b Form a high-K dielectric layer covering the second active region exposed by the gate trench — S123b Form a bit line contact structure at a bottom of the first trench, and form a gate contact layer in the gate trench, where the gate contact layer covers the high-K dielectric layer — S124b Deposit a metal material, where a part of the metal material fills unfilled regions of the first trench and the second trench, to form a bit line conductive layer, and a part of the metal material fills an unfilled region of the gate trench, to form a metal gate layer — S125b

FIG. 36

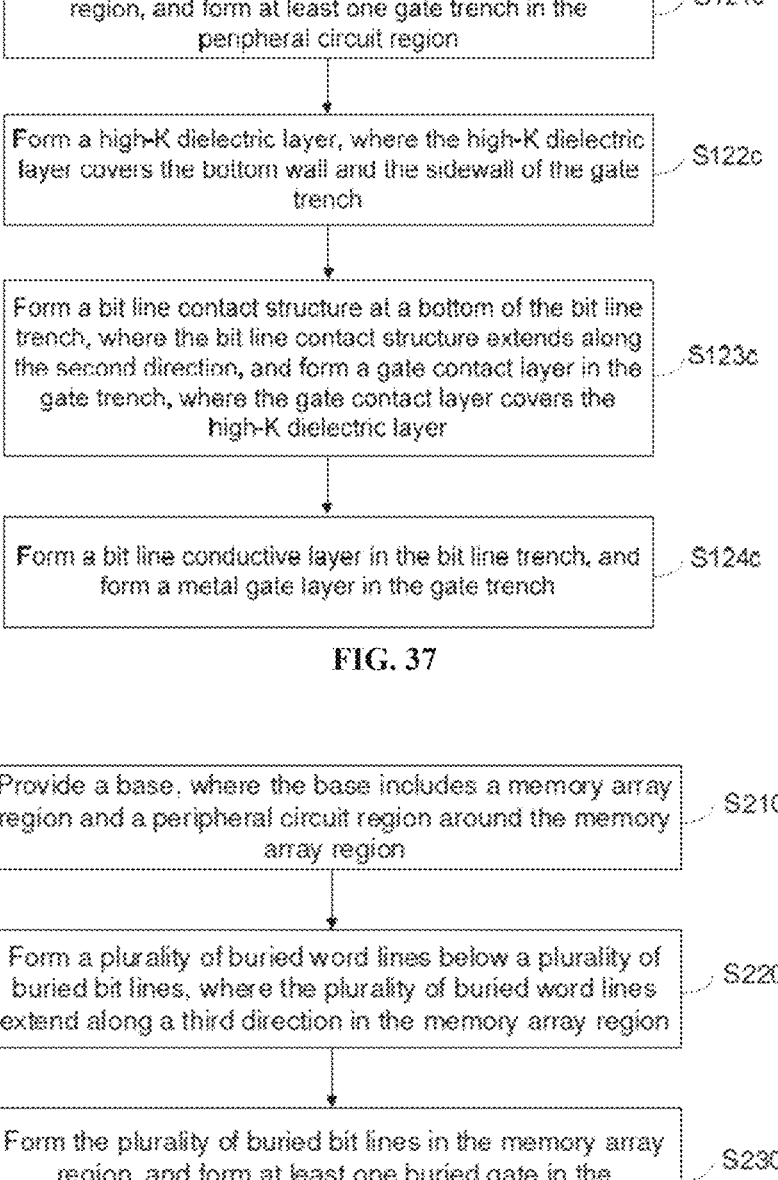

Form a plurality of bit line trenches in the memory array region, and form at least one gate trench in the peripheral circuit region — S121c Form a high-K dielectric layer, where the high-K dielectric layer covers the bottom wall and the sidewall of the gate trench — S122c Form a bit line contact structure at a bottom of the bit line trench, where the bit line contact structure extends along the second direction, and form a gate contact layer in the gate trench, where the gate contact layer covers the high-K dielectric layer — S123c Form a bit line conductive layer in the bit line trench, and form a metal gate layer in the gate trench — S124c

FIG. 37

Provide a base, where the base includes a memory array region and a peripheral circuit region around the memory array region — S210

Form a plurality of buried word lines below a plurality of buried bit lines, where the plurality of buried word lines extend along a third direction in the memory array region — S220

Form the plurality of buried bit lines in the memory array region, and form at least one buried gate in the peripheral circuit region — S230

FIG. 38

SEMICONDUCTOR STRUCTURE AND MANUFACTURING METHOD THEREOF

CROSS-REFERENCE TO RELATED APPLICATION

This application claims the priority of Chinese Patent Application No. 202210462432.9, submitted to the Chinese Intellectual Property Office on Apr. 29, 2022, the disclosure of which is incorporated herein in its entirety by reference.

TECHNICAL FIELD

The present disclosure relates to the technical field of semiconductors, and in particular to a semiconductor structure and a manufacturing method thereof.

BACKGROUND

At present, the memory array region and the peripheral circuit region of the semiconductor structure are made in different processes, and therefore the process of the semiconductor structure is complicated and time-consuming. Moreover, with the improvement of the integration degree of the semiconductor structure, the feature size of the semiconductor device is continuously reduced, and the processes of the memory array region and the peripheral circuit region of the semiconductor structure are faced with greater challenges.

SUMMARY

An overview of the subject described in detail in the present disclosure is provided below. This overview is not intended to limit the protection scope of the claims.

The present disclosure provides a semiconductor structure and a manufacturing method thereof.

A first aspect of the present disclosure provides a semiconductor structure. The semiconductor structure includes:

a base, where the base includes a memory array region and a peripheral circuit region around the memory array region;

a plurality of buried bit lines disposed in the memory array region of the base; and at least one buried gate disposed in the peripheral circuit region of the base.

A second aspect of the present disclosure provides a method of manufacturing a semiconductor structure, including the following steps:

providing a base, where the base includes a memory array region and a peripheral circuit region around the memory array region; and forming a plurality of buried bit lines in the memory array region, and forming at least one buried gate in the peripheral circuit region.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. The accompanying drawings in the following description illustrate some rather than all of the embodiments of the present disclosure. Those skilled in the art may obtain other accompanying drawings based on these accompanying drawings without creative efforts.

FIG. 4 is a cross-sectional view taken along A-A in FIG. 1 according to an exemplary embodiment;

FIG. 5 is a cross-sectional view taken along B-B in FIG. 1 according to an exemplary embodiment;

FIG. 6 is a top view of the semiconductor structure according to an exemplary embodiment;

FIG. 35 is a flowchart of forming a plurality of buried bit lines and at least one buried gate according to an exemplary embodiment;

FIG. 36 is a flowchart of forming a plurality of buried bit lines and at least one buried gate according to an exemplary embodiment;

FIG. 37 is a flowchart of forming the plurality of buried bit lines and the at least one buried gate according to an exemplary embodiment; and FIG. 38 is a flowchart of the method of manufacturing a semiconductor structure according to an exemplary embodiment.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

In the semiconductor structure and the manufacturing method thereof provided by the embodiments of the present disclosure, because the plurality of bit lines are buried in the memory array region of the base, the base supports the bit lines and can effectively prevent them from collapsing. In addition, the buried gate is disposed in the peripheral circuit region of the base, such that a trench length of the gate is equal to a sum of a length of a bottom surface of the gate in contact with the base and lengths of two sidewalls, which increases the trench length of the gate, thereby improving the ability of the gate to control the trench.

As shown in FIGS. 1 to 5, the present disclosure provides a semiconductor structure. Specifically, as shown in FIGS. 1 to 3 or 1, 4, and 5, the semiconductor structure includes a base 100, a plurality of buried bit lines 200, and at least one buried gate 300. The base 100 includes a memory array region 110 and a peripheral circuit region 120 around the memory array region 110. The buried bit lines 200 are disposed in the memory array region 110 of the base 100, and the at least one buried gate 300 is disposed in the peripheral circuit region 120 of the base 100. The memory array region 110 is configured to store data. The peripheral circuit region 120 is configured to form transistors and contact structures with other functions (for example, test functions).

Figure 2:
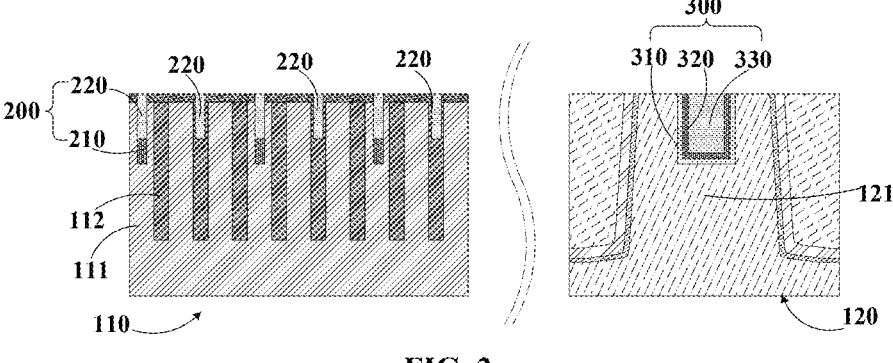
FIG. 2 is a cross-sectional view taken along A-A in FIG. 1 according to an exemplary embodiment.

In an embodiment, as shown in FIG. 2 or 4, the plurality of buried bit lines 200 and the at least one buried gate 300 are formed in the same process, and bottom surfaces of the plurality of buried bit lines 200 are flush with a bottom surface of the at least one buried gate 300, thereby shortening the manufacturing process. Certainly, it can be understood that according to practical requirements, the bottom surfaces of the plurality of buried bit lines 200 may be higher or lower than the bottom surface of the at least one buried gate 300.

Figure 1:
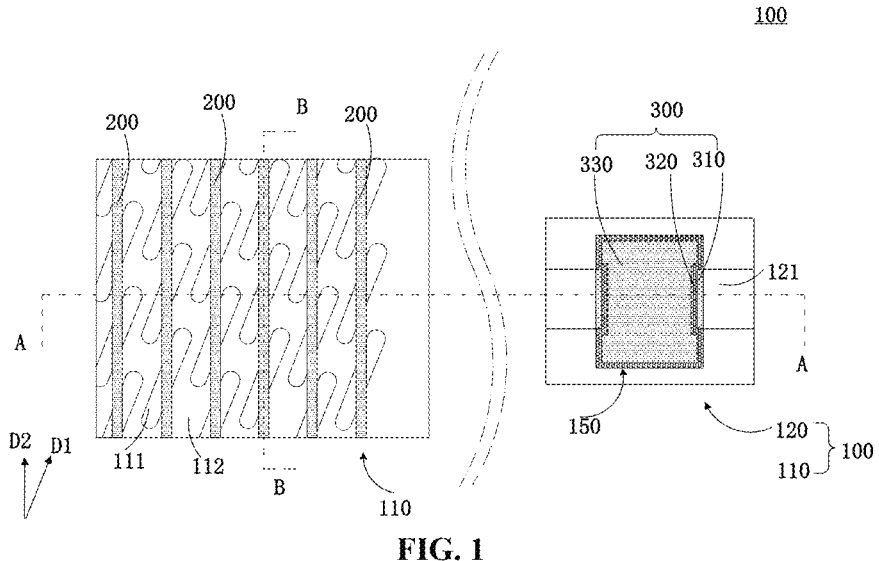
FIG. 1 is a top view of a semiconductor structure according to an exemplary embodiment.

In an embodiment, as shown in FIG. 1, the memory array region 110 includes a plurality of first active regions 111 arranged in an array, each of the first active regions 111 extends along a first direction D1, and the first active regions 111 are isolated by using an isolation structure 112. As shown in FIGS. 1 to 3 or 1, 4, and 5, the buried bit line 200 includes a bit line contact structure 210 and a bit line conductive layer 220 that are disposed sequentially; the bit line contact structure 210 is connected to the first active region 111; and the bit line conductive layer 220 is connected to the bit line contact structure 210. The bit line conductive layer 220 extends along a second direction D2 in the memory array region 110 and penetrates through a column of first active regions 111, and the second direction D2 intersects the first direction D1 non-perpendicularly. It can be understood that, according to the actual process, the bottom surface of the buried bit line 200 located in the first active region 111 and the bottom surface of the buried bit line 200 located in the isolation structure 112 may be at different heights. For example, the bottom surface of the buried bit line 200 located in the first active region 111 may be higher than that of the buried bit line 200 in the isolation structure 112.

Figure 3:
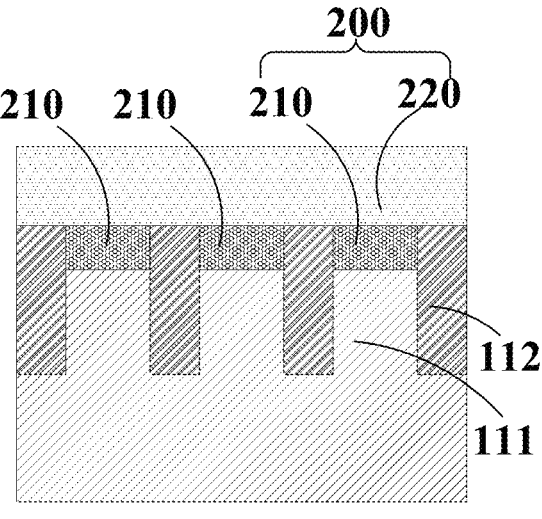
FIG. 3 is a cross-sectional view taken along B-B in FIG. 1 according to an exemplary embodiment.

In an example, as shown in FIGS. 1 to 3, the buried bit line 200 includes the bit line conductive layer 220 and a plurality of bit line contact structures 210 connected to the bit line conductive layer 220, and the bit line contact structures 210 are arranged in an array and each disposed on the first active region 111. The bit line contact structure 210 is located in the overlapping region between the bit line conductive layer 220 and the first active region 111. The bit line conductive layer 220 covers top surfaces of the bit line contact structures 210.

In this example, each first active region 111 is correspondingly provided with a bit line contact structure 210. Each bit line conductive layer 220 penetrates through a column of first active regions 111 and covers top surfaces of a column of bit line contact structures 210 in this column of first active regions 111. The bit line conductive layer 220, by using the bit line contact structure 210, is connected to the first active region 111 through which the bit line conductive layer penetrates. The bit line contact structure 210 is configured to reduce the contact resistance between the bit line conductive layer 220 and the first active region 111, and the volume ratio of the bit line contact structure 210 in each buried bit line 200 is small. This avoids that the bit line contact structure 210 increases the resistance of the buried bit line 200, to make the buried bit line 200 have good conductivity.

In another embodiment, as shown in FIGS. 1, 4, and 5, each of the buried bit lines 200 covers a bit line contact structure 210 and the bit line conductive layer 220 that are stacked sequentially. The bit line contact structure 210 extends along the second direction D2, and is located below the bit line conductive layer 220. In this embodiment, in a direction from the top surface of the base 100 to the bottom surface of the base 100, each buried bit line 200 includes a bit line conductive layer 220 and a bit line contact structure 210 that are arranged in sequence. The bit line conductive layer 220 extends in the memory array region 110 along the second direction D2 and penetrates through a column of the first active regions 111. The bit line contact structure 210 also extends in the memory array region 110 along the second direction D2 and penetrates through a column of the first active regions 111. Each bit line conductive layer 220 covers the top surface of one bit line contact structure 210 below it.

In the semiconductor structure of this example, the bit line contact structure 210 of the buried bit line 200 is located below the bit line conductive layer 220. Both the bit line contact structure 210 and the bit line conductive layer 220 extend along the second direction D2. The fabrication process of the buried bit line 200 is simple, and the alignment of the bit line contact structure 210 and the bit line conductive layer 220 is high.

In an embodiment, as shown in FIG. 1, the peripheral circuit region 120 includes a second active region 121, and at least one buried gate 300 penetrates through the second active region 121. The buried gate 300 includes a high-K dielectric layer 310, a gate contact layer 320, and a metal gate layer 330 that are arranged sequentially. The second active region 121 is separated from the memory array region 110 by using the isolation structure 112. A gate trench 150 (with reference to FIG. 11) is formed in the second active region 121 of the base 100. As shown in FIG. 1, the high-K dielectric layer 310 at least partially covers the sidewall and the bottom surface of the gate trench 150. The gate contact layer 320 covers the sidewall and the bottom surface of the high-K dielectric layer 310. The metal gate layer 330 covers the sidewall and the bottom surface of the gate contact layer 320 and fills the remaining region of the gate trench 150, and the upper surface of the metal gate layer 330 is flush with the top surface of the base 100.

In an example, as shown in FIG. 1, the buried gate 300 penetrates through the second active region 121 in its extension direction, and a part of the gate trench 150 is located in the second active region 121. The rest of the gate trench 150 is located in the base 100 adjacent to the second active region 121. The high-K dielectric layer 310 only partially covers the sidewall and the bottom surface of the gate trench 150 in the second active region 121. The gate contact layer 320 may cover only the high-K dielectric layer 310 (with reference to FIG. 21), or as shown in FIG. 1, the gate contact layer 320 may cover the high-K dielectric layer 310 and a part of the sidewall and a part of the bottom surface of the gate trench 150 outside the second active region 121. In this example, the buried gate 300 is buried in the second active region 121, and the buried gate 300 penetrates through the second active region 121 in its extension direction. The channel length of the buried gate 300 is increased, and the ability of the buried gate 300 to control the channel is increased.

In another example, the gate trench 150 is disposed in the second active region 121, and the sidewall of the gate trench 150 is surrounded by the second active region 121. The high-K dielectric layer 310 covers the sidewall and the bottom surface of the gate trench 150, and the gate contact layer 320 covers the high-K dielectric layer 310. The metal gate layer 330 covers the sidewall and the bottom surface of the gate contact layer 320 and fills the gate trench 150.

Figures 16, 17, 18:
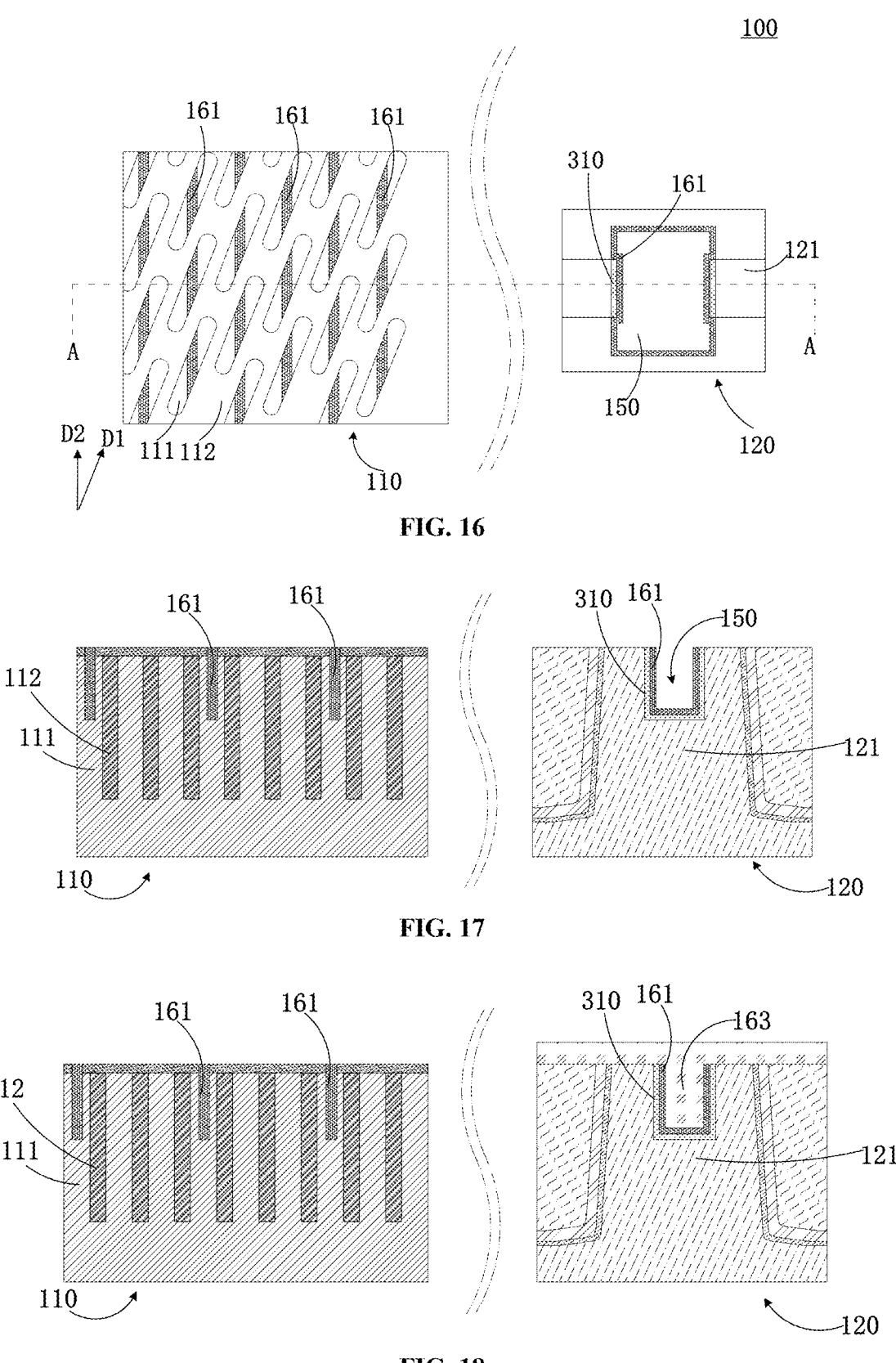
FIG. 16 is a top view of removing the contact material layer on a top surface of the base according to an exemplary embodiment.
FIG. 17 is a cross-sectional view of removing the contact material layer on the top surface of the base taken along A-A in FIG. 16 according to an exemplary embodiment.
FIG. 18 is a top view of filling the gate trench with a sacrificial material in FIG. 16 according to an exemplary embodiment.
Figure 22:
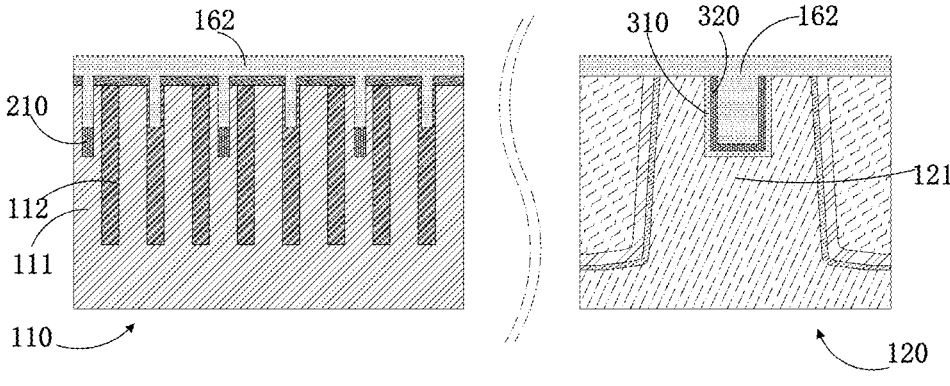
FIG. 22 is a cross-sectional view of forming a metal material layer taken along A-A in FIG. 19 according to an exemplary embodiment.
Figure 27:
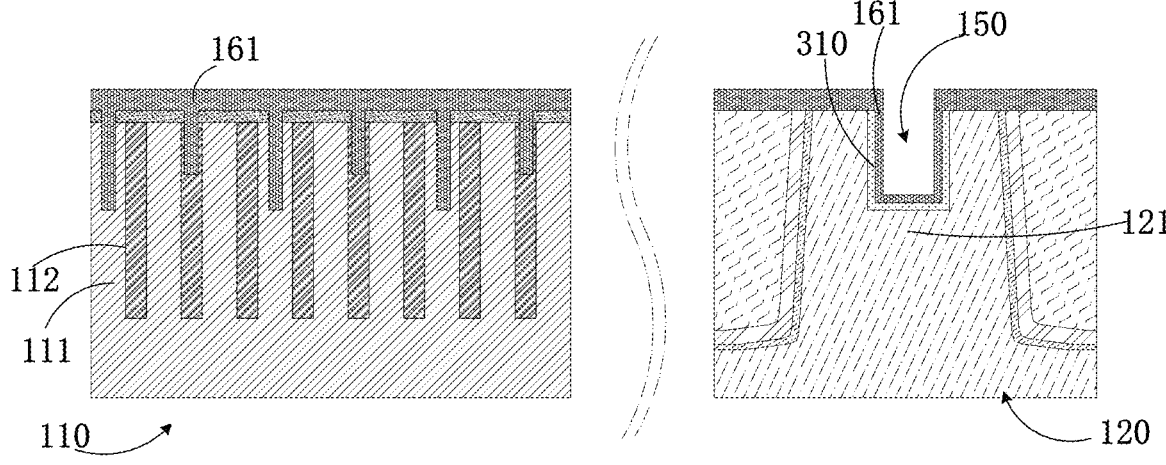
FIG. 27 is a cross-sectional view of forming the contact material layer taken along A-A in FIG. 25 according to an exemplary embodiment.
Figure 32:
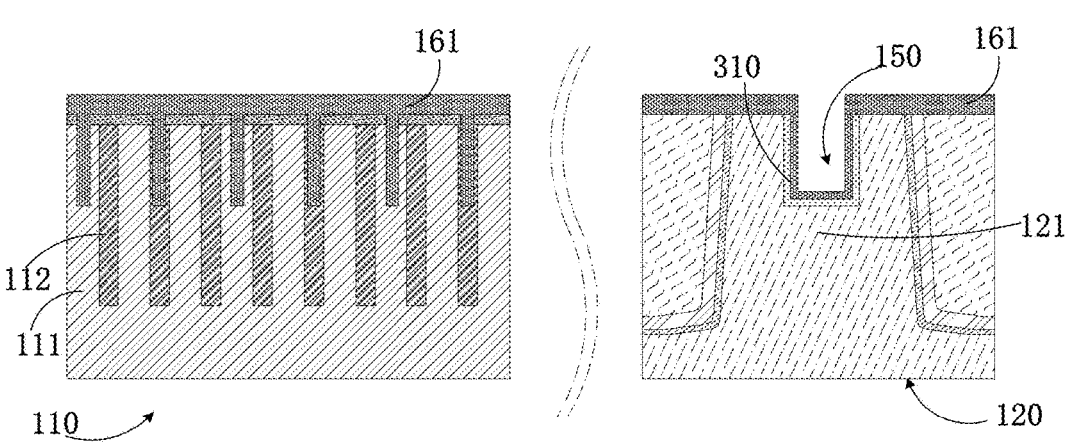
FIG. 32 is a cross-sectional view of the contact material layer taken along A-A in FIG. 29 according to an exemplary embodiment.

In some possible embodiments, with reference to FIG. 17, 27, or 32, the bit line contact structure 210 of the buried bit line 200 and the gate contact layer 320 of the buried gate 300 are made of a same contact material layer 161. The material of the contact material layer 161 includes a doped semiconductor material such as n-type or p-type conductive doped monocrystalline silicon or polycrystalline silicon. Conductive doped monocrystalline or polycrystalline silicon can be used to adjust the work function of the buried gate 300. With reference to FIG. 2, 4, or 22, the bit line conductive layer 220 of the buried bit line 200 and the metal gate layer 330 of the buried gate 300 are made of a same metal material layer 162. The material of the metal material layer 162 includes conductive metal such as metal titanium (titanium), metal tantalum (tantalum), metal tungsten (tungsten) or alloys thereof.

Figures 7, 8, 9:
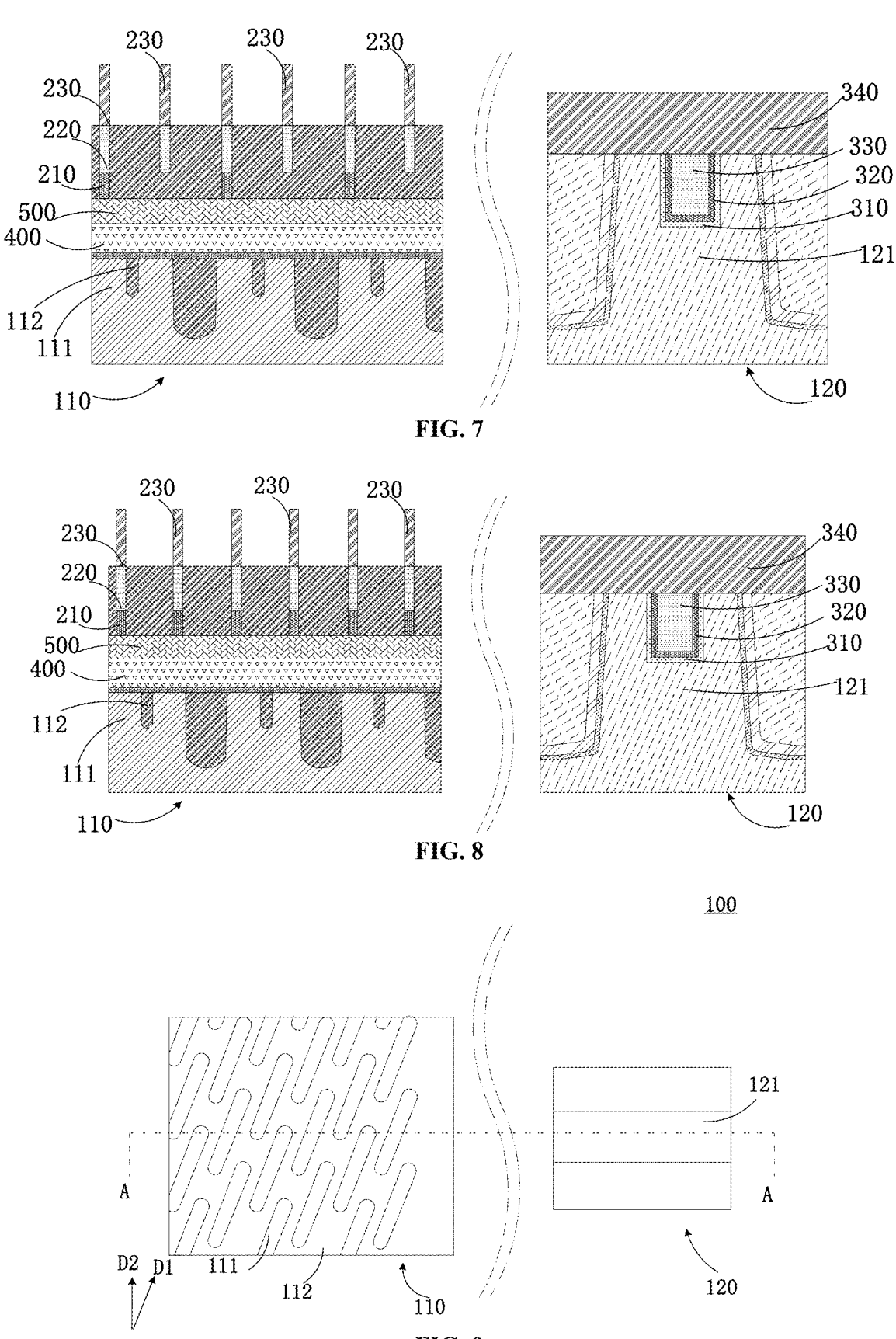
FIG. 7 is a cross-sectional view taken along C-C in FIG. 6 according to an exemplary embodiment.
FIG. 8 is a cross-sectional view taken along C-C in FIG. 6 according to an exemplary embodiment.
FIG. 9 is a top view of a base according to an exemplary embodiment.

In some possible embodiments, as shown in FIGS. 6 to 8, the semiconductor structure further includes a plurality of bit line insulating layers 230. The plurality of bit line insulating layers 230 are disposed in the memory array region 110. Each bit line insulating layer 230 correspondingly covers to a top surface of the bit line conductive layer 220 of the buried bit line 200. The semiconductor structure further includes at least one gate insulating layer 340, and the at least one gate insulating layer 340 is disposed in the peripheral circuit region 120. The at least one gate insulating layer 340 covers the top surface of the at least one buried gate 300 and the top surface of the second active region 121.

In some embodiments, as shown in FIGS. 6, 7, and 8, the semiconductor structure further includes a plurality of buried word lines 400 disposed in the memory array region 110, and each extending along a third direction D3, and located below the buried bit lines 200. Top surfaces of the plurality of buried word lines 400 are lower than the bottom surfaces of the plurality of buried bit lines 200, and a spacing structure 500 is formed between the plurality of buried word lines 400 and the plurality of buried bit lines 200. The third direction D3 intersects the first direction D1 non-perpendicularly, and the third direction D3 is perpendicular to the second direction D2.

In the memory array region 110 of the semiconductor structure in this embodiment, the plurality of buried word lines 400 are disposed below the plurality of buried bit lines 200. This reduces the area of the semiconductor structure occupied by the plurality of buried word lines 400 and the plurality of buried bit lines 200, and improves the space utilization rate of the semiconductor structure.

Figure 34:
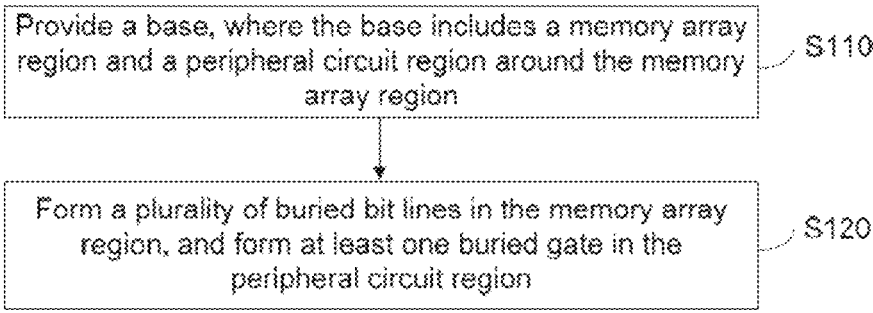
FIG. 34 is a flowchart of a method of manufacturing a semiconductor structure according to an exemplary embodiment.

As shown in FIG. 34, an exemplary embodiment of the present disclosure provides a method of manufacturing a semiconductor structure, including the following steps:

Step S110: Provide a base, where the base includes a memory array region and a peripheral circuit region around the memory array region.

Figures 10, 11, 12:
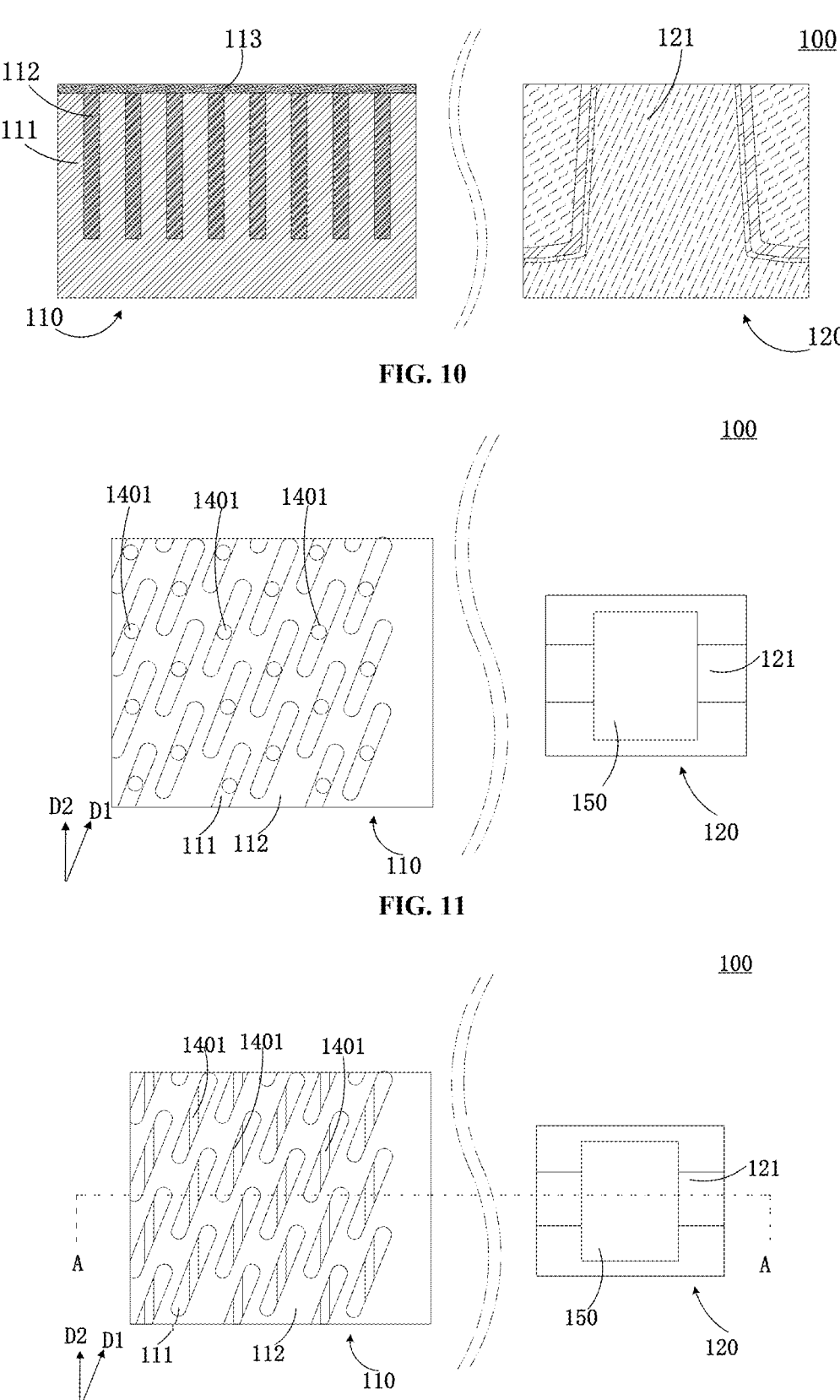
FIG. 10 is a cross-sectional view of the base taken along A-A in FIG. 9 according to an exemplary embodiment.
FIG. 11 is a top view of forming a first trench and a gate trench according to an exemplary embodiment.
FIG. 12 is a top view of forming the first trench and the gate trench according to an exemplary embodiment.

As shown in FIGS. 9 and 10, the memory array region 110 includes a plurality of first active regions 111 arranged in an array, each of the first active regions 111 extends along a first direction D1, and the plurality of first active regions 111 are isolated by using an isolation structure 112. The isolation structure 112 is configured to isolate adjacent first active regions 111, to avoid a short circuit of the semiconductor structure due to the electrical connection of the first active regions 111.

The material of the first active region 111 includes a semiconductor material, which may be silicon (Si), germanium (Ge), silicon germanium (GeSi), or silicon carbide (SiC). The semiconductor material may further be silicon-on-insulator (SOI), germanium-on-insulator (GOD; or other materials, such as III-V group compounds such as gallium arsenide. In an embodiment, the material of the first active region 111 includes silicon. Materials of the isolation structure 112 include low-K materials such as silicon oxide, silicon nitride, and silicon oxynitride. The peripheral circuit region 120 includes a second active region 121, and the second active region 121 and the first active region 111 are made of a same material.

In some embodiments, as shown in FIG. 10, the base 100 further includes an isolation layer 113, and the isolation layer 113 covers at least the top surfaces of the first active region 111 and the isolation structure 112 in the memory array region 110. The isolation layer 113 is configured to prevent the first active region 111 from being oxidized to ensure that the first active region 111 has good conductivity.

Step S120: Form a plurality of buried bit lines in the memory array region, and form at least one buried gate in the peripheral circuit region.

Figure 21:
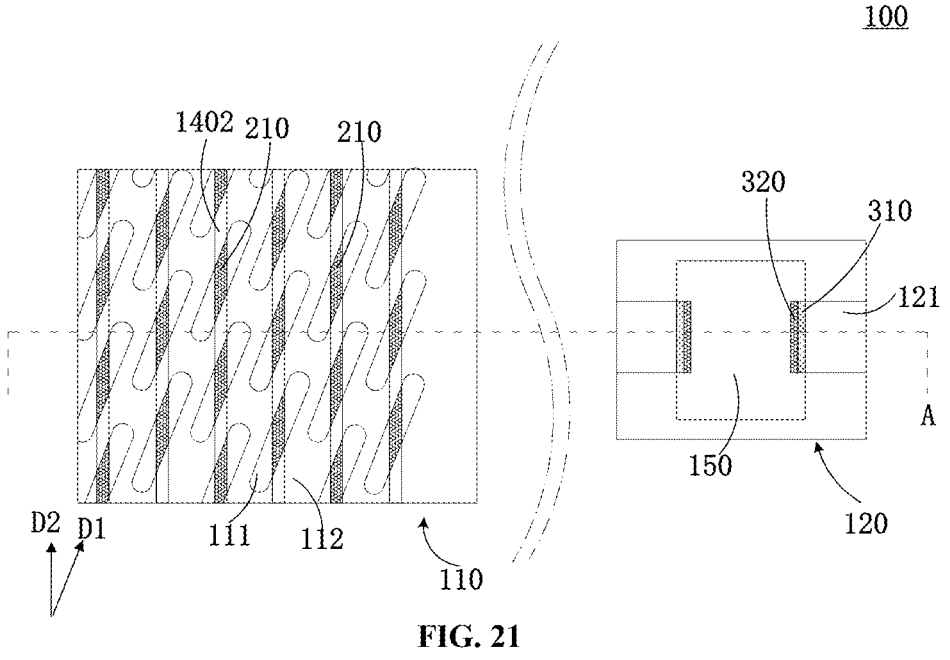
FIG. 21 is a top view of forming the second trench according to an exemplary embodiment.
Figure 25:
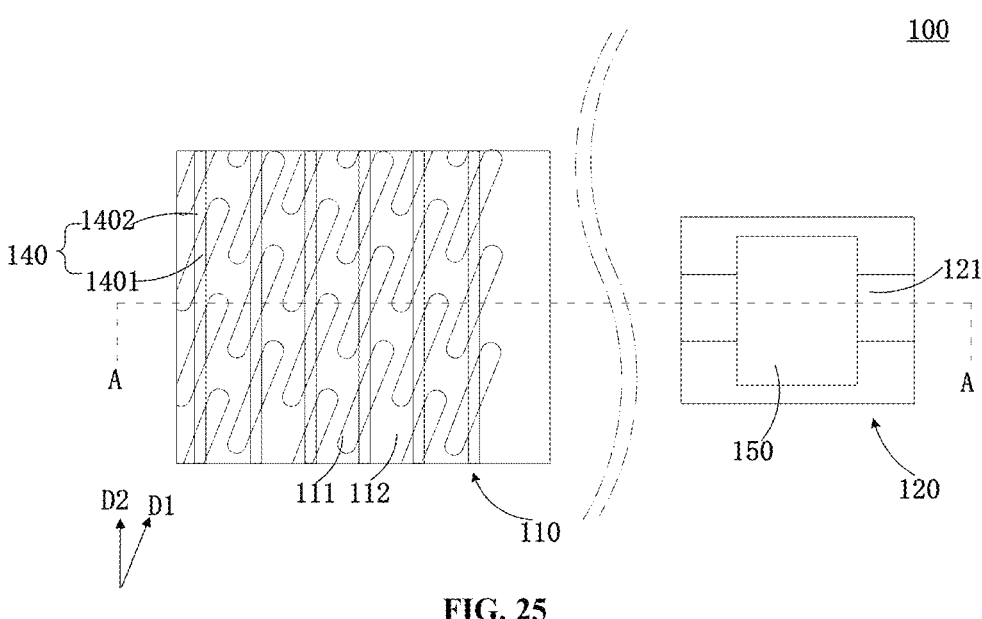
FIG. 25 is a top view of forming a bit line trench and the gate trench taken along A-A according to an exemplary embodiment.
Figure 29:
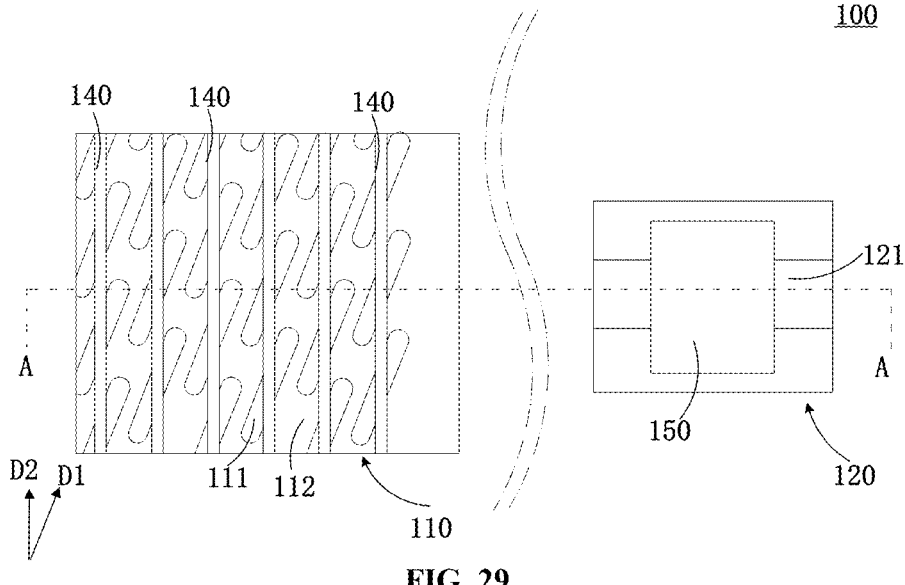
FIG. 29 is a top view of forming the bit line trench and the gate trench according to an exemplary embodiment.

As shown in FIGS. 21, 25, and 29, the buried bit lines 200 may be formed in the memory array region 110 by using the following method.

A plurality of bit line trenches 140 are formed in the memory array region 110. Each bit line trench 140 extends along the second direction D2 and at least partially penetrates through a column of first active regions 111. The second direction D2 intersects the first direction D1 non-perpendicularly. As shown in FIGS. 1 to 3 or 1, 4, and 5, the buried bit line 200 is formed in each bit line trench 140, and the buried bit line 200 includes a bit line conductive layer 220 and a bit line contact structure 210 disposed below the bit line conductive layer 220. The bit line contact structure 210 is connected to the first active region 111, and the bit line conductive layer 220 is connected to the bit line contact structure 210. The bit line conductive layer 220 extends along a second direction D2 in the memory array region 110 and penetrates through a column of first active regions 111.

As shown in FIGS. 21, 25, and 29, the at least one buried gate 300 is formed in the peripheral circuit region 120 may be using the following method.

At least one gate trench 150 is formed in the peripheral circuit region 120, and at least a part of the gate trench 150 is disposed in the second active region 121. As shown in FIGS. 1 to 3, or 1, 4, and 5, a buried gate 300 is formed in the gate trench 150. Along a direction from the trench wall of the gate trench 150 to the center of the gate trench 150, the buried gate 300 includes a high-K dielectric layer 310, a gate contact layer 320, and a metal gate layer 330 that are arranged sequentially.

In the manufacturing method in this embodiment, the buried bit lines are buried in the memory array region. This reduces the area occupied by the buried bit lines in the memory array region and improves the space utilization rate of the memory array region. The bit line is integrally arranged in the base, and the base supports the bit line, preventing the bit line from collapsing. At least one buried gate is buried in the peripheral circuit region. A trench length of the gate is equal to a sum of a length of a bottom surface of the gate in contact with the base and lengths of two sidewalls, which increases the trench length of the gate, thereby improving the ability of the gate to control the trench. In addition, the buried bit lines and the at least one buried gate are formed at the same time. This reduces the process steps and saves the process time.

This embodiment is a further description of a possible implementation of step S120 in the foregoing embodiment. As shown in FIG. 35, in the implementation process, the step of forming the plurality of buried bit lines in the memory array region, and forming the at least one buried gate in the peripheral circuit region includes the following steps:

Step S121a: Form a plurality of first trenches in the memory array region, where the plurality of first trenches are correspondingly arranged in the plurality of first active regions, and form at least one gate trench in the peripheral circuit region.

Figure 13:
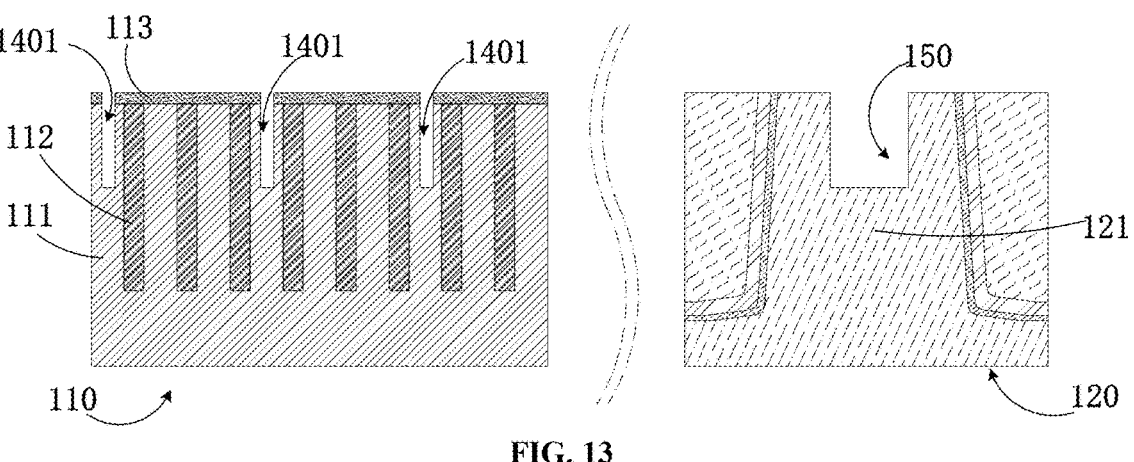
FIG. 13 is a cross-sectional view of the first trench and the gate trench taken along A-A in FIG. 12 according to an exemplary embodiment.

As shown in FIG. 13, with reference to FIG. 10, the base 100 is etched, and the first active regions 111 are partially removed to form a plurality of first trenches 1401 in the first active regions 111 correspondingly. The plurality of first trenches 1401 are arranged in a plurality of columns along the second direction D2, and a part of the second active region 121 and a part of base 100 adjacent to the second active region 121 are removed. At least one gate trench 150 is formed in the peripheral circuit region 120, and the at least one gate trench 150 penetrates through the second active region 121. The gate trench 150 is wider than the first trench 1401. In this step, the plurality of first trenches 1401 and at least one gate trench 150 are formed in the same process. Bottom surfaces of the plurality of first trenches 1401 are flush with that of at least one gate trench 150.

As shown in FIG. 11, the first trench 1401 may be disposed in the first active region 111, and the first active region 111 defines a trench wall of the first trench 1401. Alternatively, as shown in FIG. 12, in the second direction D2, the first trench 1401 is as wide as the first active region 111. The first trench 1401 penetrates through the first active region 111 along the second direction D2. The projection of the first trench 1401 formed on the base 100 is quadrilateral. In this embodiment, the top view of the first trench 1401 is shown in FIG. 12, and the projection formed on the base 100 is quadrilateral. With reference to FIGS. 2 and 3, the contact area between the bit line contact structure 210 formed in the first active region 111 and the first active region 111 is the greatest. The bit line contact structure 210 can better reduce the contact area between the bit line conductive layer 220 and the first active region 111.

In an embodiment, as shown in FIG. 12, the gate trench 150 penetrates through the second active region 121 in its extension direction, and a part of the gate trench 150 is located in the second active region 121. The rest of the gate trench 150 is located in the base 100 adjacent to the second active region 121. The length of the gate trench 150 in the second active region 121 is the greatest, which can increase the channel length of the buried gate 300 formed subsequently and increase the space for forming the buried gate 300.

Step S122a: Form a high-K dielectric layer covering the second active region exposed by the gate trench.

Figure 14:
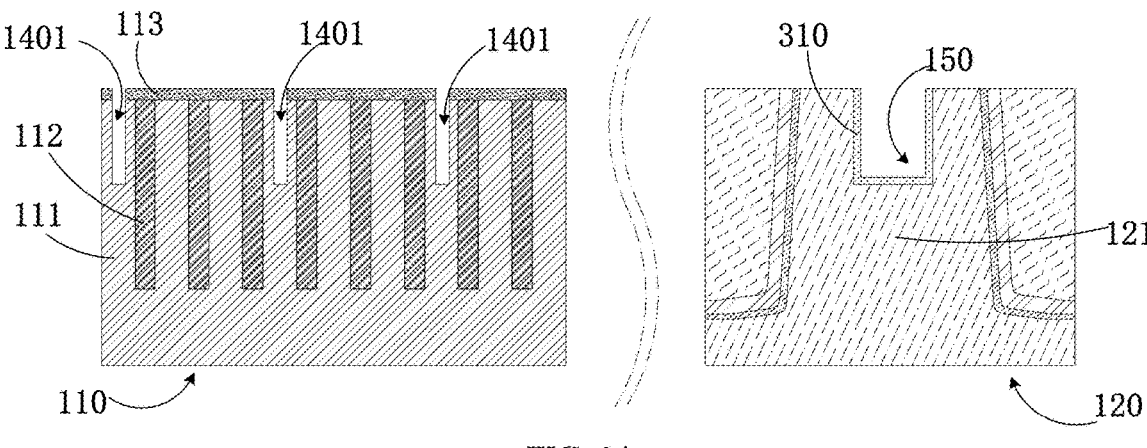
FIG. 14 is a cross-sectional view of forming a high-K dielectric layer taken along A-A in FIG. 12 according to an exemplary embodiment.

As shown in FIG. 14, with reference to FIG. 13, the high-K dielectric layer 310 may be formed by using the following method: The semiconductor structure is placed in a reaction chamber, oxygen is introduced into the reaction chamber, and the semiconductor structure is processed through the thermal oxidation process. Because the notch of the first trench 1401 is small, it is difficult for oxygen to flow into the first trench 1401. The second active region 121 exposed by at least one gate trench 150 is selectively oxidized to form a high-K dielectric layer 310. The high-K dielectric layer 310 at least covers the second active region 121 exposed by the gate trench 150. The material of the high-K dielectric layer 310 includes hafnium oxide ($HfO_2$).

In an embodiment, a protective layer (not shown in the figure) may be formed after deposition in the memory array region 110 of the base 100. A high-K dielectric layer is formed on the second active region 121 exposed in the peripheral circuit region 120, and then the protective layer of the memory array region 110 is removed.

In an embodiment, a chlorine-containing gas may be introduced into the reaction chamber, and chlorine ions are doped into the high-K dielectric layer 310 to combine with positive ions in the high-K dielectric layer 310. In this way, the free positive ions in the high-K dielectric layer 310 are reduced, and the charge defects on the junction surface of the high-K dielectric layer 310 and the second active region 121 are reduced, thereby improving the electrical performance of the formed buried gate 300. For example, the chlorine-containing gas may include at least one of hydrogen chloride (HCl), trichloroethylene (TCE), or chloroform.

Step S123a: Form a contact material layer by depositing a contact material, where the contact material layer fills the plurality of first trenches and covers the high-K dielectric layer in the gate trench.

Figure 15:
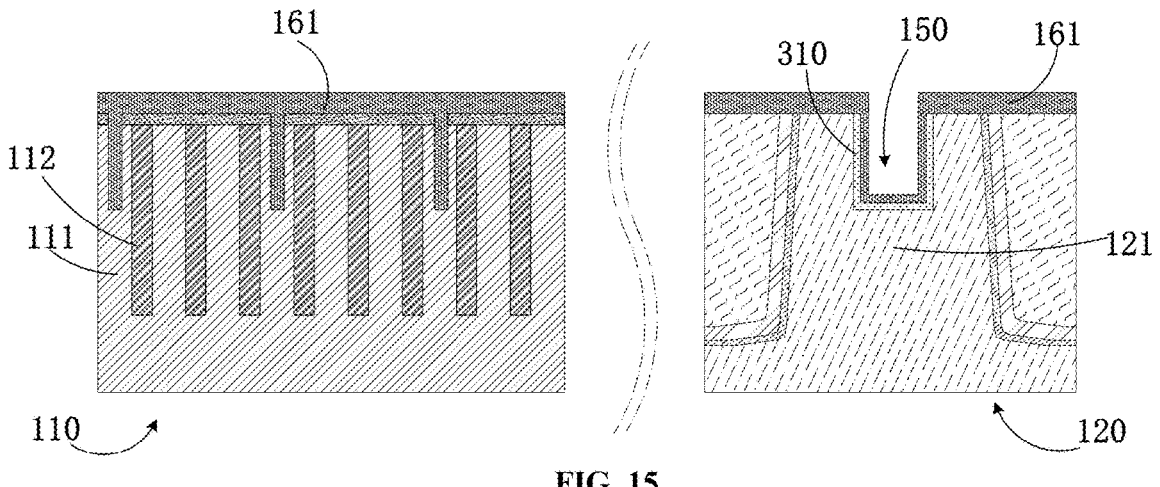
FIG. 15 is a cross-sectional view of a contact material layer taken along A-A in FIG. 12 according to an exemplary embodiment.

As shown in FIG. 15, with reference to FIG. 14, the contact material is deposited through atomic layer deposition (ALD) or chemical vapor deposition (CVD). Because the gate trench 150 is wider than the first trench 1401, a speed at which the contact material fills the first trench 1401 is greater than a speed at which the contact material fills the gate trench 150. The deposition is stopped after the first trench 1401 is filled up, to form the contact material layer 161. The contact material layer 161 fills up the plurality of first trenches 1401, and the contact material layer 161 covers the high-K dielectric layer 310 and the top surface of the base 100. The contact material layer 161 further covers a part, of the trench wall of the gate trench 150, not covered by the high-K dielectric layer 310.

Figure 19:
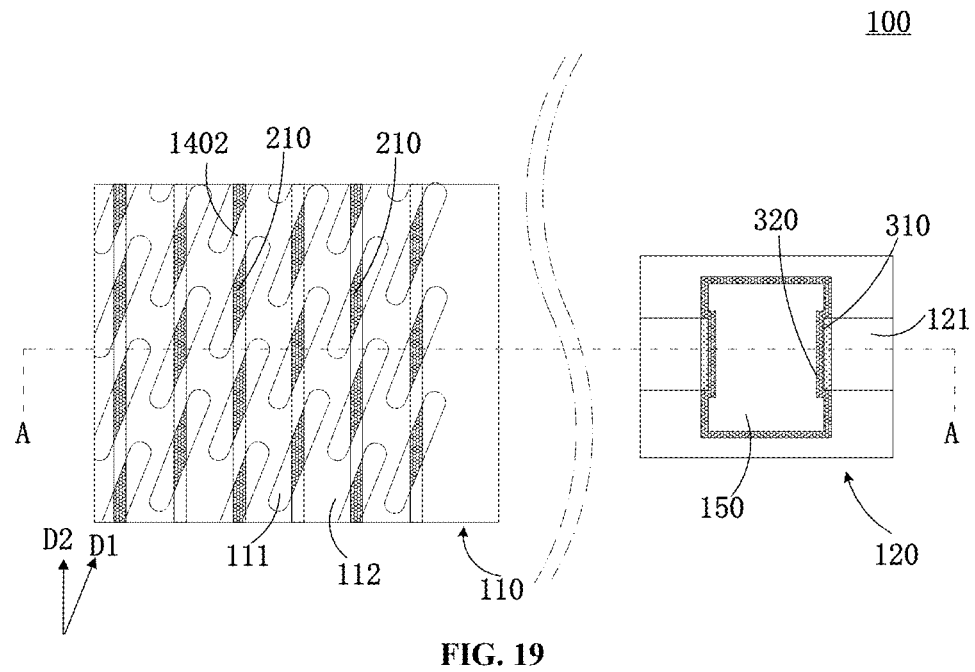
FIG. 19 is a top view of forming a second trench according to an exemplary embodiment.
Figure 20:
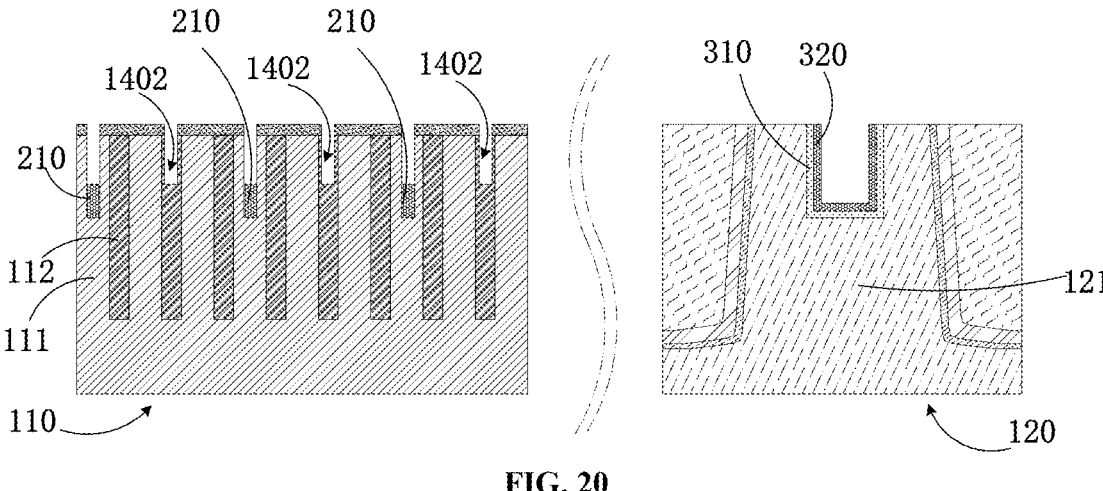
FIG. 20 is a cross-sectional view of forming the second trench along A-A in FIG. 19 according to an exemplary embodiment.

As shown in FIG. 17, with reference to FIG. 15, the contact material layer 161 covering the top surface of the base 100 is etched back for removal, and the contact material layer 161 retained in each gate trench 150 forms a gate contact layer 320. As shown in FIGS. 19 and 20, in an example, the gate contact layer 320 covers the high-K dielectric layer 310, and the trench wall, of the gate trench 150, not covered by the high-K dielectric layer 310. As shown in FIG. 21, in another example, a part of the contact material layer 161 in the gate trench 150 may further be removed through an etching process. Only the part covering the high-K dielectric layer 310 is retained as the gate contact layer 320 to retain more space in the gate trench 150 for the subsequent formation of the metal gate layer 330.

Step S124a: Form a plurality of second trenches in the memory array region, where each of the second trenches extends along a second direction, penetrates through a column of the first active regions, and communicates with the first trench formed in the column of first active regions, a bottom surface of the second trench is higher than a bottom surface of the first trench, and the second direction intersects the first direction non-perpendicularly.

As shown in FIG. 18, with reference to FIG. 17, the following methods can be used to form the plurality of second trenches 1402 in the memory array region 110:

The gate trench 150 is filled with a sacrificial material 163, and the top surface of the peripheral circuit region 120 is coated with the sacrificial material 163, to avoid a damage on the peripheral circuit region 120 in the subsequent etching process of the memory array region 110. The sacrificial material 163 may be photoresist, spin-on carbon, or the like.

As shown in FIGS. 19 and 20, with reference to FIGS. 16 and 18, a part of the base 100 and a part of the contact material layer 161 in the first trench 1401 are removed through etching. A plurality of second trenches 1402 are formed in the memory array region 110, and each extends along the second direction D2, and each communicates with a column of the first trenches 1401. The second trenches 1402 and the column of the first trenches 1401 in communication with them form a bit line trench 140. The contact material layer 161 retained after the etching in each of the first trenches 1401 forms a bit line contact structure 210, and the top surface of the bit line contact structure 210 is flush with the bottom surface of the second trench 1402.

Step S125a: Deposit a metal material, where a part of the metal material fills unfilled regions of the first trench and the second trench, to form a bit line conductive layer, and a part of the metal material fills an unfilled region of the gate trench, to form a metal gate layer.

After the sacrificial material 163 (with reference to FIG. 18) is removed, as shown in FIG. 22, with reference to FIGS. 19 and 20, the metal material is deposited through the ALD or CVD process. The metal material fills the unfilled regions of the first trench 1401 and the second trench 1402, the unfilled region of the gate trench 150 and the top surface of the base 100, to form the metal material layer 162. The material of the metal material layer 162 includes conductive metals such as metal titanium (titanium), metal tantalum (tantalum), metal tungsten (tungsten) or alloys thereof.

As shown in FIGS. 1 to 3, with reference to FIG. 22, the metal material layer 162 on the top surface of the base 100 is etched back for removal, and the metal material layer 162 retained in the first trench 1401 and the second trench 1402 form the bit line conductive layers 220. The bottom surface of the bit line conductive layer 220 covers top surfaces of a column of bit line contact structures 210 and is in contact with the first active regions 111 through the column of bit line contact structures 210. The metal material layer 162 filling the gate trench 150 forms a metal gate layer 330, and the metal gate layer 330 is connected to the second active region 121 through the gate contact layer 320. The top surface of the bit line conductive layer 220 is flush with the top surface of the metal gate layer 330. The top surface of the bit line conductive layer 220 and the top surface of the metal gate layer 330 are both flush with or below the top surface of the base 100.

In this embodiment, the bit line trench is formed in two steps: forming first trenches and forming second trenches. When the second trench is formed, the contact material layer in the first trench is partially removed. The formed bit line contact structure is located in the first trench below the bottom surface of the second trench. In this embodiment, the buried bit line includes a column of bit line contact structures and a bit line conductive layer covering the top surfaces of the column of bit line contact structures. The bit line conductive layer is in contact with the first active region by using the bit line contact structure. The bit line contact structure reduces the contact resistance between the bit line conductive layer and the first active region. The volume ratio of the bit line contact structure in the buried bit line is small. This avoids that a higher resistance of the material of the bit line contact structure causes the overall resistance of the buried bit line to increase, such that the buried bit line has good conductivity. In the method of manufacturing this embodiment, the buried bit lines in the memory array region and the buried gates in the peripheral circuit region are formed in the same process, which simplifies the process and reduces the process time.

This embodiment is a further description of another possible implementation of step S120 in the foregoing embodiment. As shown in FIG. 36, in the implementation process, the step of forming the plurality of buried bit lines in the memory array region, and forming the at least one buried gate in the peripheral circuit region includes the following steps:

Step S121b: Perform first etching on the base, form a plurality of initial trenches in the memory array region, where the plurality of initial trenches are correspondingly arranged in the plurality of first active regions, and form at least one initial gate trench in the peripheral circuit region.

Figure 23:
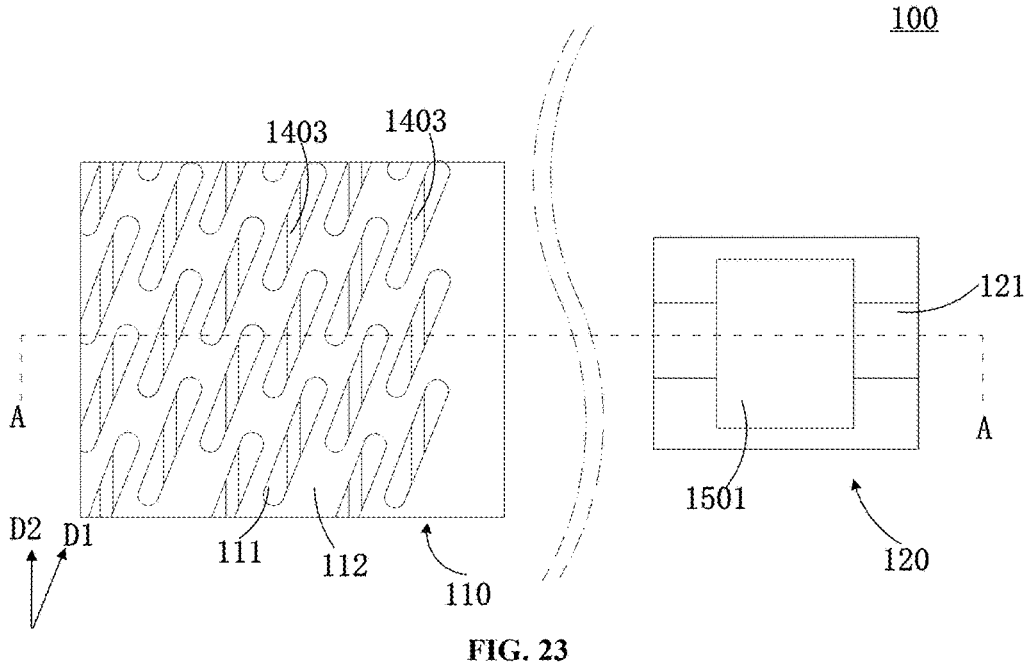
FIG. 23 is a top view of forming an initial trench and an initial gate trench according to an exemplary embodiment.
Figure 24:
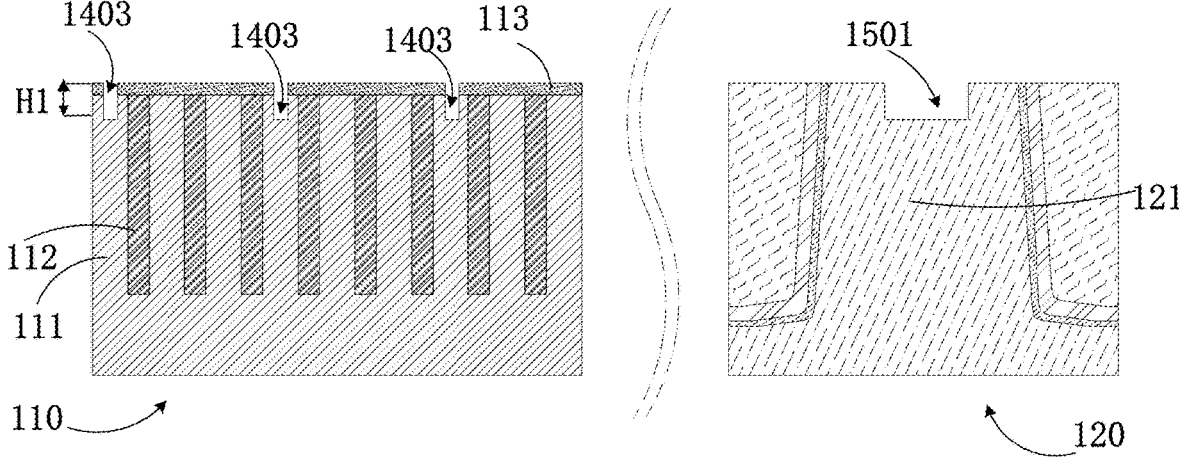
FIG. 24 is a cross-sectional view of forming an initial trench and an initial gate trench taken along A-A in FIG. 23 according to an exemplary embodiment.

As shown in FIGS. 23 and 24, with reference to FIGS. 9 and 10, the performing first etching on the base 100 includes: forming a first mask layer (not shown in the figure) on the top surface of the base 100, where the first mask layer exposes a part of the top surface of each of the first active regions 111, a part of the top surface of the second active region 121, and a part of the top surface of the base 100 adjacent to the second active region 121, etching the base 100 based on the first mask layer, to correspondingly form an initial trench 1403 in each of the first active regions 111, and forming an initial gate trench 1501 in the peripheral circuit region 120, where the initial gate trench 1501 penetrates through the second active region 121 in its extension direction.

As shown in FIG. 24, the depth of the first etching is a first depth H1, and a bottom surface of the initial trench 1403 is flush with that of the initial gate trench 1501. The trench depths of the initial trenches 1403 and the initial gate trenches 1501 are both the first depth H1.

Step S122b: Perform second etching on the base, to form a plurality of bit line trenches in the memory array region, where each of the bit line trenches includes a second trench extending along the second direction and a column of first trenches in communication with the second trench, and form at least one gate trench in the peripheral circuit region.

Figure 26:
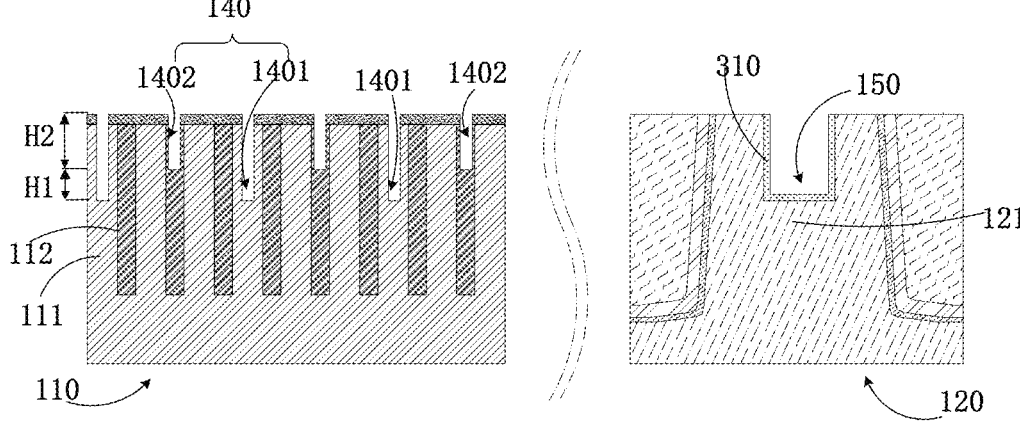
FIG. 26 is a cross-sectional view of forming a bit line trench and the gate trench taken along A-A in FIG. 25 according to an exemplary embodiment.

In an embodiment, as shown in FIGS. 25 and 26, with reference to FIGS. 23 and 24, the performing second etching on the base 100 includes: removing the first mask layer, and forming a second mask layer (not shown in the figure) on the top surface of the base 100, where the second mask layer exposes a part of the top surface of the isolation structure 112 of the memory array region 110, the initial trench 1403, and the initial gate trench 1501. The base 100 is etched based on the second mask layer, and a part of the isolation structure 112 located between the adjacent initial trenches 1403 in the same column is removed to form a plurality of second trenches 1402, while etching down is performed based on the initial trench 1403, to form a first trench 1401 in the first active region 111. The second trench 1402 and a column of first trenches 1401 in communication with the second trench form a bit line trench 140. During the second etching, based on the initial gate trench 1501, the peripheral circuit region 120 is etched downward, to form the gate trench 150. A bottom surface of the gate trench 150 is flush with that of the first trench 1401. In an embodiment, the second trench 1402 is narrower than the gate trench 150.

In an embodiment, the etching process of the second etching may be dry etching or wet etching, and the isolation structure 112, the first active region 111, the second active region 121, and a part of the base 100 adjacent to the second active region 121 are all etched at a same speed. As shown in FIG. 26, the depth of the second etching is a second depth H2, the trench depth of the second trench 1402 is the second depth H2, and the bottom surface of the first trench 1401 is lower than the bottom surface of the second trench 1402 by the first depth H1. The depth of the gate trench 150 is equal to the sum of the first depth H1 and the second depth H2.

Step S123b: Form a high-K dielectric layer covering the second active region exposed by the gate trench.

As shown in FIG. 26, the step of forming the high-K dielectric layer 310 in this embodiment is the same as the implementation of step S122a in the foregoing embodiment. Details are not described herein again. The high-K dielectric layer 310 covers the second active region 121 exposed by the gate trench 150.

Step S124b: Form a bit line contact structure at a bottom of the first trench, and form a gate contact layer in the gate trench, where the gate contact layer covers the high-K dielectric layer;

First, as shown in FIG. 27, with reference to FIG. 26, a contact material layer 161 is formed by depositing a contact material, where the contact material layer 161 fills the plurality of first trenches 1401 and covers the high-K dielectric layer 310 in the gate trench 150. The contact material may be deposited through atomic layer deposition process or chemical vapor deposition process. The contact material fills the first trench 1401 and the second trench 1402. A part of the contact material covers the high-K dielectric layer 310, a part of the trench wall, of the gate trench 150, not covered by the high-K dielectric layer 310, and the top surface of the base 100, to form the contact material layer 161.

Figure 28:
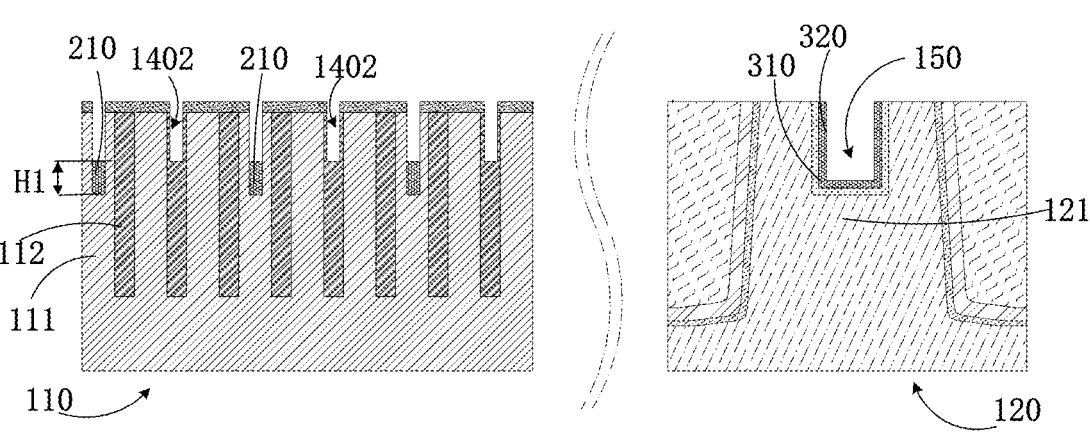
FIG. 28 is a cross-sectional view of forming a bit line contact structure and a gate contact layer taken along A-A in FIG. 25 according to an exemplary embodiment.

Then, with reference to FIGS. 19 and 28, the contact material layer 161 on the top surface of the base 100 is etched back for removal, and the contact material layer 161 retained in each gate trench 150 forms a gate contact layer 320. The gate contact layer 320 covers the high-K dielectric layer 310 and a part of the trench wall of the gate trench 150 in the base 100 adjacent to the second active region 121.

Next, the gate trench 150 is filled with a sacrificial material 163 (with reference to FIG. 18), and the top surface of the peripheral circuit region 120 is coated with the sacrificial material 163, to avoid a damage on the peripheral circuit region 120 in the subsequent etching process of the memory array region 110.

As shown in FIG. 28, the bottom wall of the second trench 1402 is used as an etch stop layer. The contact material layer 161 in the second trench 1402 is etched back for removal. The contact material layer 161 in each of the first trenches 1401 is retained to form the bit line contact structure 210. The top surface of the bit line contact structure 210 is flush with the bottom surface of the second trench 1402.

With reference to FIG. 21, the contact material layer 161, in the gate trench 150, not covering the high-K dielectric layer 310, may be removed through etching. The formed gate contact layer 320 only covers the high-K dielectric layer 310 to increase the space of the gate trench 150 for forming the metal gate layer 330.

Step S125b: Deposit a metal material, where a part of the metal material fills unfilled regions of the first trench and the second trench, to form a bit line conductive layer, and a part of the metal material fills an unfilled region of the gate trench, to form a metal gate layer.

As shown in FIGS. 1 to 3, the steps of forming the bit line conductive layer 220 and forming the metal gate layer 330 are the same as the implementations in step S125a in the above embodiment. This is not repeated herein again. The top surface of the bit line conductive layer 220 is flush with the top surface of the metal gate layer 330. The top surface of the bit line conductive layer 220 and the top surface of the metal gate layer 330 are both flush with or below the top surface of the base 100.

In an embodiment, an initial trench is formed in the first active region through the first etching, and then the initial trench is transferred downward by the second depth through the second etching. The first trench is formed in the first active region, while through the second etching, the second trench extending along the second direction is also formed, and the second trench communicates with a column of the first trenches. The method of manufacturing this embodiment ensures that the bottom surface of the first trench is lower than the bottom surface of the second trench by the first depth, thereby avoiding that the first trench is combined with the second trench due to the etching. This manufacturing method has a lower control demand on the etching precision, and therefore the yield of the formed semiconductor structure is high.

In an embodiment, with reference to FIG. 20, a bit line contact structure 210 is formed at the bottom of each first trench 1401. After the gate contact layer 320 is formed in each gate trench 150, the method further includes: forming a barrier layer (not shown in the figure) through deposition. The barrier layer covers the surface of the bit line contact structure 210 and the gate contact layer 320, and the surface of the first active region 111 exposed by the first trench 1401 or the second trench 1402, and/or covers the surface of the gate contact layer 320 in the second active region 121. Then, a metal material is deposited on the barrier layer to avoid contamination of the base due to diffusion of the metal material, and the barrier layer material includes but is not limited to titanium nitride.

This embodiment is a further description of another possible implementation of step S120 in the foregoing embodiment. As shown in FIG. 37, in the implementation process, the step of forming the plurality of buried bit lines in the memory array region, and forming the at least one buried gate in the peripheral circuit region includes the following steps:

Step S121c: Form a plurality of bit line trenches in the memory array region, and form at least one gate trench in the peripheral circuit region.

Figure 30:
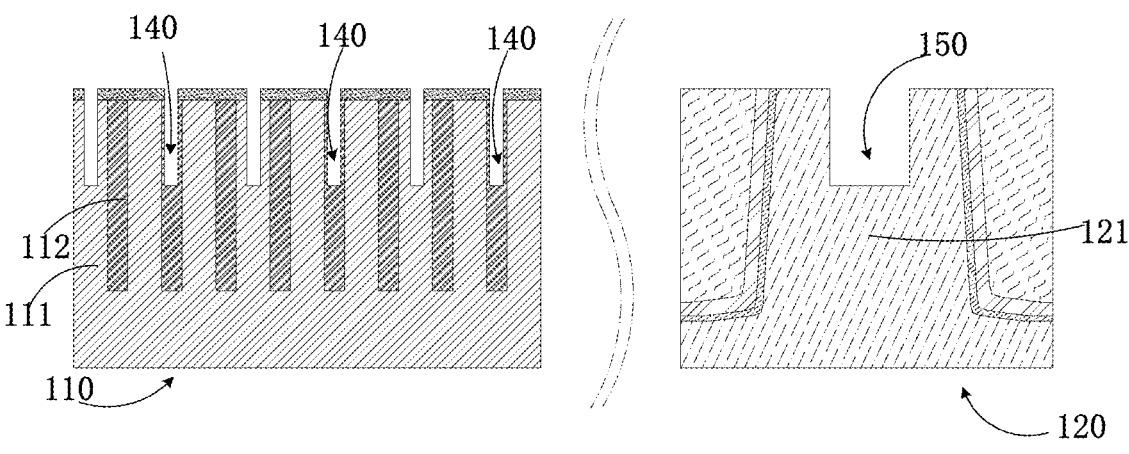
FIG. 30 is a cross-sectional view of forming the bit line trench and the gate trench taken along A-A in FIG. 29 according to an exemplary embodiment.

In an embodiment, as shown in FIGS. 29 and 30, with reference to FIGS. 9 and 10, the first active region 111 and the isolation structure 112 in the memory array region 110 are partially removed, to form a plurality of bit line trenches 140 in the memory array region 110. A part of the second active region 121 of the peripheral circuit region 120 and a part of the base 100 adjacent to the second active region 121 are removed. At least one gate trench 150 is formed in the memory array region 110, and the gate trench 150 penetrates through the second active region 121. In an embodiment, the bottom surfaces of the plurality of bit line trenches 140 are flush with that of the at least one gate trench 150, and the plurality of bit line trench 140 is narrower than the at least one gate trench 150.

As shown in FIG. 29, the bit line trench 140 extends along a second direction D2 in the memory array region 110 and penetrates through a column of first active regions 111, and the second direction D2 intersects the first direction D1 non-perpendicularly. The bit line trenches 140 formed in this embodiment are strip-shaped trenches extending along the second direction D2, and along the depth direction of the bit line trenches 140, the bit line trenches 140 have the same width up and down.

Step S122c: Form a high-K dielectric layer, where the high-K dielectric layer covers the bottom wall and the sidewall of the gate trench.

Figure 31:
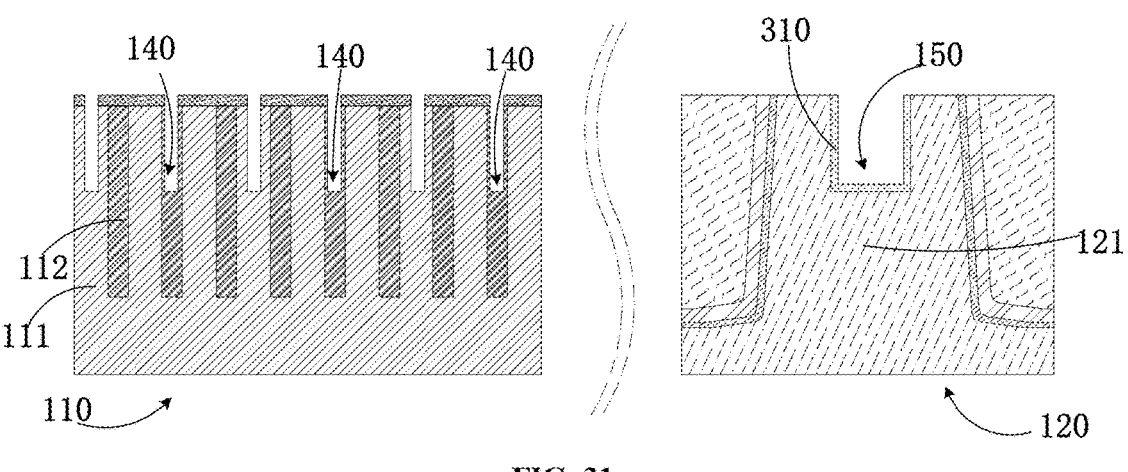
FIG. 31 is a cross-sectional view of forming the high-K dielectric layer taken along A-A in FIG. 29 according to an exemplary embodiment.

As shown in FIG. 31, the step of forming the high-K dielectric layer 310 in this embodiment is the same as the implementation of step S122a in the foregoing embodiment. Details are not described herein again. The high-K dielectric layer 310 covers the second active region 121 exposed by the gate trench 150.

Step S123c: Form a bit line contact structure at a bottom of the bit line trench, where the bit line contact structure extends along the second direction, and form a gate contact layer in the gate trench, where the gate contact layer covers the high-K dielectric layer.

First, as shown in FIG. 32, with reference to FIG. 31, a contact material is deposited. After the contact material fills up the bit line trench 140, the deposition is stopped to form the contact material layer 161. The contact material layer 161 fills the bit line trenches 140, covers the trench wall of the gate trench 150, and the top surface of the base 100.

Figure 33:
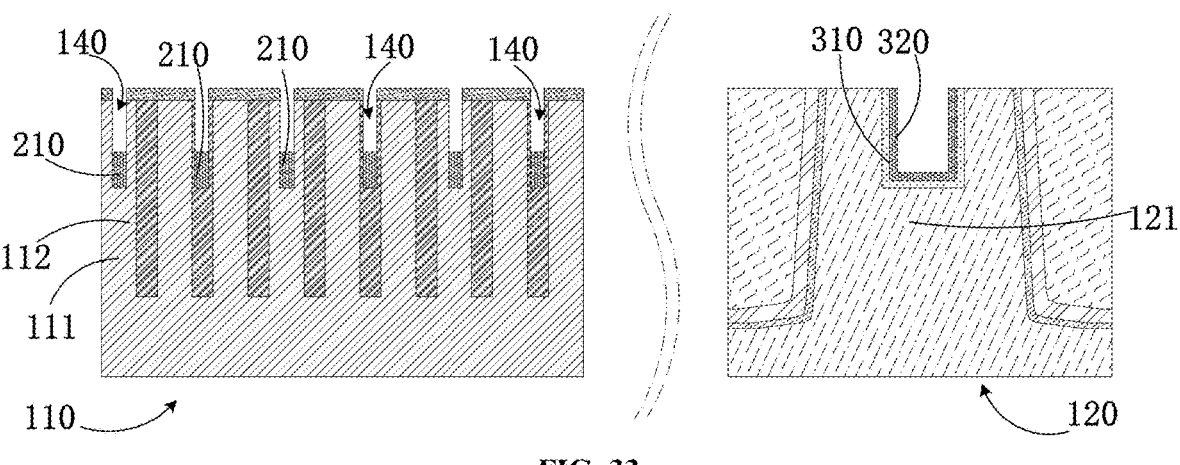
FIG. 33 is a cross-sectional view of forming a bit line contact structure and a gate contact layer taken along A-A in FIG. 29 according to an exemplary embodiment.

Then, as shown in FIG. 33, with reference to FIG. 32, the contact material layer 161 on the top surface of the base 100 is etched back for removal, and the contact material layer 161 in the gate trench 150 forms a gate contact layer 320. In some embodiments, with reference to FIG. 20, the gate contact layer 320 covers the high-K dielectric layer 310 and a part of the trench wall of the gate trench 150 outside the second active region 121. In some embodiments, with reference to FIG. 21, the contact material layer 161 outside the second active region 121 may be removed through etching. The formed gate contact layer 320 only covers the high-K dielectric layer 310 to increase the space of the gate trench 150 for forming the metal gate layer 330.

Next, the gate trench 150 is filled with a sacrificial material 163 (with reference to FIG. 18), and the top surface of the peripheral circuit region 120 is coated with the sacrificial material 163, to avoid a damage on the peripheral circuit region 120 in the subsequent etching process of the memory array region 110.

Then, as shown in FIG. 33, with reference to FIG. 32, the contact material layer 161 in the bit line trench 140 is etched back by a predetermined depth. A part of the contact material layer 161 retained after etching in the bit line trench 140 forms the bit line contact structure 210. The bit line contact structure 210 is located at the bottom of the bit line trench 140, and the bit line contact structure 210 extends continuously in the bit line trench 140 along the second direction D2.

The sacrificial material 163 in the gate trench 150 and the sacrificial material 163 (with reference to FIG. 18) on the top surface of the peripheral circuit region 120 are removed, to subsequently process the peripheral circuit region 120.

Step S124c: Form a bit line conductive layer in the bit line trench, and form a metal gate layer in the gate trench.

As shown in FIGS. 1, 4, and 5, the steps of forming the bit line conductive layer 220 and forming the metal gate layer 330 are the same as the implementations in step S125a in the above embodiment. The bit line conductive layer 220 and the metal gate layer 330 are formed through the same metal material layer 162 (with reference to FIG. 22). This is not repeated herein again.

As shown in FIGS. 1, 4, and 5, with reference to FIG. 33, the bit line conductive layer 220 fills the unfilled region of each bit line trench 140. The bit line conductive layer 220 extends along the second direction D2 and covers the bit line contact structures 210 in each of the bit line trenches 140. The metal gate layer 330 fills the unfilled region of each gate trench 150, and the metal gate layer 330 covers the gate contact layer 320. The top surface of the bit line conductive layer 220 is flush with the top surface of the metal gate layer 330. The top surface of the bit line conductive layer 220 and the top surface of the metal gate layer 330 are both flush with or below the top surface of the base 100.

In an embodiment, with reference to FIGS. 31 and 33, before the bit line contact structure 210 is formed at the bottom of the bit line trench 140, the method further includes: depositing a barrier layer (not shown in the figure) through deposition. The barrier layer covers the surface of the first active region 111 exposed by the bit line trench 140, and then the bit line contact structure 210 and the bit line conductive layer 220 are formed on the barrier layer, to avoid contamination of the base 100 due to diffusion of the metal material. The material of the barrier layer includes but is not limited to titanium nitride.

In the method of manufacturing this embodiment, the base is etched only once, and the bit line trenches and the at least one gate trench are simultaneously formed in the base, such that the process steps are reduced, the difficulty of the process is reduced, the process time is saved, and the yield of the semiconductor structure can be improved.

According to an exemplary embodiment, compared with the foregoing embodiment, this embodiment further includes the following steps:

forming a plurality of bit line insulating layers, where each of the bit line insulating layers correspondingly covers the top surface of the bit line conductive layer of the buried bit line, and forming at least one gate insulating layer, where the at least one gate insulating layer covers the top surface of the at least one buried gate and the top surface of the second active region.

In an embodiment, with reference to FIGS. 7 and 8, the plurality of bit line insulating layers 230 are disposed in the memory array region 110. The semiconductor structure further includes at least one gate insulating layer 340, and the at least one gate insulating layer 340 is disposed in the peripheral circuit region 120. The at least one gate insulating layer 340 covers the top surface of the at least one buried gate 300 and the top surface of the second active region 121. In this embodiment, the plurality of bit line insulating layers 230 and the at least one gate insulating layer 340 are formed in the same insulating material layer (not shown in the figure).

According to an exemplary embodiment, as shown in FIG. 38, the method of manufacturing a semiconductor structure in this embodiment includes the following steps:

Step S210: Provide a base, where the base includes a memory array region and a peripheral circuit region around the memory array region.

Step S220: Form a plurality of buried word lines below a plurality of buried bit lines, where the plurality of buried word lines extend along a third direction in the memory array region.

Step S230: Form a plurality of buried bit lines in the memory array region, and form at least one buried gate in the peripheral circuit region.

The implementation of step S210 in this embodiment is the same as that of step S110 in the foregoing embodiment, and the implementation of step S230 in this embodiment is the same as that of step S120 in the foregoing embodiment. This is not repeated herein again.

As shown in FIGS. 6, 7, and 8, with reference to FIGS. 1, 2, and 4, top surfaces of the plurality of buried word lines 400 are lower than bottom surfaces of the plurality of buried bit lines 200. A spacing structures 500 is formed between the plurality of buried word lines 400 and the plurality of buried bit lines 200. The third direction D3 intersects the first direction D1 non-perpendicularly, and the third direction D3 intersects the second direction D2.

In this embodiment, the plurality of buried word lines and the plurality of buried bit lines are all buried in the memory array region. This reduces the area occupied by the plurality of buried word lines and the plurality of buried bit lines in the semiconductor structure, and improves the space utilization rate of the semiconductor structure.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

The invention claimed is:

1. A semiconductor structure, comprising:
a base, wherein the base comprises a memory array region and a peripheral circuit region around the memory array region;
a plurality of buried bit lines disposed in the memory array region of the base; and
at least one buried gate disposed in the peripheral circuit region of the base;
wherein the memory array region comprises a plurality of first active regions arranged in an array, at least one of the plurality of buried bit lines penetrates through a column of first active regions.

2. The semiconductor structure according to claim 1, wherein bottom surfaces of the plurality of buried bit lines are flush with a bottom surface of the at least one buried gate.

3. A semiconductor structure, comprising:
a base, wherein the base comprises a memory array region and a peripheral circuit region around the memory array region;
a plurality of buried bit lines disposed in the memory array region of the base; and
at least one buried gate disposed in the peripheral circuit region of the base;
wherein the memory array region comprises a plurality of first active regions arranged in an array, each of the first active regions extends along a first direction, and the plurality of first active regions are isolated by using an isolation structure;
the buried bit line comprises a bit line contact structure and a bit line conductive layer that are disposed sequentially; the bit line contact structure is connected to the first active region; and the bit line conductive layer is connected to the bit line contact structure; and
the bit line conductive layer extends along a second direction in the memory array region and penetrates through a column of first active regions, and the second direction intersects the first direction non-perpendicularly.

4. The semiconductor structure according to claim 3, wherein the buried bit line comprises the bit line conductive layer and a plurality of bit line contact structures connected to the bit line conductive layer, and the plurality of bit line contact structures are arranged in an array and each disposed on the first active region; and
the bit line conductive layer covers top surfaces of a plurality of the bit line contact structures.

5. The semiconductor structure according to claim 3, wherein each of the buried bit lines comprises the bit line contact structure and the bit line conductive layer that are stacked sequentially, and the bit line contact structure extends along the second direction.

6. The semiconductor structure according to claim 3, wherein the peripheral circuit region comprises a second active region, and the at least one buried gate penetrates through the second active region; and
the buried gate comprises a high-K dielectric layer, a gate contact layer, and a metal gate layer that are disposed sequentially.

7. The semiconductor structure according to claim 6, wherein a gate trench is formed in the second active region of the base, the high-K dielectric layer covers a sidewall and a bottom surface of the gate trench, the gate contact layer covers a sidewall and a bottom surface of the high-K dielectric layer, the metal gate layer covers a sidewall and a bottom surface of the gate contact layer, and an upper surface of the metal gate layer is flush with a top surface of the base.

8. The semiconductor structure according to claim 6, wherein the bit line contact structure of the buried bit line and the gate contact layer of the buried gate are made of a same contact material layer, and the bit line conductive layer of the buried bit line and the metal gate layer of the buried gate are made of a same metal material layer.

9. The semiconductor structure according to claim 3, further comprising:
a plurality of buried word lines disposed in the memory array region, wherein each of the buried word lines extends along a third direction and are located below the plurality of buried bit lines, top surfaces of the plurality of buried word lines are lower than bottom surfaces of the plurality of buried bit lines, and a spacing structure is disposed between the plurality of buried word lines and the plurality of buried bit lines; and
the third direction intersects the first direction non-perpendicularly, and the third direction intersects the second direction perpendicularly.

10. A method of manufacturing a semiconductor structure, comprising:
providing a base, wherein the base comprises a memory array region and a peripheral circuit region around the memory array region; and
forming a plurality of buried bit lines in the memory array region, and forming at least one buried gate in the peripheral circuit region;
wherein the memory array region comprises a plurality of first active regions arranged in an array, each of the first active regions extends along a first direction, and the plurality of first active regions are isolated by using an isolation structure; the peripheral circuit region comprises a second active region; and the forming a plurality of buried bit lines in the memory array region, and forming at least one buried gate in the peripheral circuit region comprises:
forming a plurality of first trenches in the memory array region, wherein the plurality of first trenches are correspondingly arranged in the plurality of first active regions, and forming at least one gate trench in the peripheral circuit region, wherein the at least one gate trench penetrates through the second active region, and bottom surfaces of the plurality of first trenches are flush with a bottom surface of the at least one gate trench; and
forming a plurality of second trenches in the memory array region, wherein each of the second trenches extends along a second direction, penetrates through a column of the first active regions, and communicates with the first trench formed in the column of the first active regions, a bottom surface of the second trench is higher than the bottom surface of the first trench, and the second direction intersects the first direction non-perpendicularly.

11. The method of manufacturing the semiconductor structure according to claim 10, after the forming at least one gate trench in the peripheral circuit region, comprising:
forming a high-K dielectric layer covering the second active region exposed by the gate trench;

forming a bit line contact structure at a bottom of the first trench, and forming a gate contact layer in the gate trench, wherein the gate contact layer covers the high-K dielectric layer; and depositing a metal material, wherein a part of the metal material fills unfilled regions of the first trench and the second trench, to form a bit line conductive layer, and a part of the metal material fills an unfilled region of the gate trench, to form a metal gate layer; and a top surface of the bit line conductive layer is flush with a top surface of the metal gate layer, and the top surface of the bit line conductive layer and the top surface of the metal gate layer are both flush with or below a top surface of the base.

12. The method of manufacturing the semiconductor structure according to claim 11, wherein the forming a bit line contact structure at a bottom of the first trench, and forming a gate contact layer in the gate trench comprises:

forming a contact material layer, wherein the contact material layer fills the plurality of first trenches and covers the high-K dielectric layer in the gate trench; and partially removing the contact material layer, wherein the contact material layer retained in the first trench forms the bit line contact structure, and the contact material layer retained in the gate trench forms the gate contact layer.

13. The method of manufacturing the semiconductor structure according to claim 10, wherein the memory array region comprises a plurality of first active regions arranged in an array, each of the first active regions extends along a first direction, and the plurality of first active regions are isolated by using an isolation structure; the peripheral circuit region comprises a second active region; and the forming a plurality of buried bit lines in the memory array region, and forming at least one buried gate in the peripheral circuit region comprises:

forming a plurality of bit line trenches in the memory array region, and forming at least one gate trench in the peripheral circuit region, wherein each of the bit line trenches extends in the memory array region along a second direction and penetrates through a column of first active regions, the second direction intersects the first direction non-perpendicularly, the at least one gate trench penetrates through the second active region, and bottom surfaces of the plurality of bit line trenches are flush with a bottom surface of the at least one gate trench.

14. The method of manufacturing the semiconductor structure according to claim 13, after the forming at least one gate trench in the peripheral circuit region, further comprising:

forming a high-K dielectric layer covering the second active region exposed by the gate trench;

forming a bit line contact structure at a bottom of the bit line trench, wherein the bit line contact structure extends along the second direction, and forming a gate contact layer in the gate trench, wherein the gate contact layer covers the high-K dielectric layer; and forming a bit line conductive layer in the bit line trench, wherein the bit line conductive layer fills an unfilled region of the bit line trench, extends along the second direction, and covers the bit line contact structure in the bit line trench, and forming a metal gate layer in the gate trench, wherein the metal gate layer fills an unfilled region of the gate trench, and covers the gate contact layer; and a top surface of the bit line conductive layer is flush with a top surface of the metal gate layer.

15. The method of manufacturing the semiconductor structure according to claim 10, before the forming a plurality of buried bit lines in the memory array region, further comprising:

forming a plurality of buried word lines below the buried bit lines, wherein the plurality of buried word lines extend along a third direction in the memory array region, top surfaces of the plurality of buried word lines are lower than the bottom surfaces of the plurality of buried bit lines, and a spacing structure is formed between the plurality of buried word lines and the plurality of buried bit lines; and the third direction intersects the first direction non-perpendicularly, and the third direction is perpendicular to the second direction.

16. The method of manufacturing the semiconductor structure according to claim 13, before the forming a plurality of buried bit lines in the memory array region, further comprising:

forming a plurality of buried word lines below the buried bit lines, wherein the plurality of buried word lines extend along a third direction in the memory array region, top surfaces of the plurality of buried word lines are lower than the bottom surfaces of the plurality of buried bit lines, and a spacing structure is formed between the plurality of buried word lines and the plurality of buried bit lines; and the third direction intersects the first direction non-perpendicularly, and the third direction is perpendicular to the second direction.

* * * * *